United States Patent
Wang et al.

(10) Patent No.: US 11,031,639 B2
(45) Date of Patent: Jun. 8, 2021

(54) METAL BATTERY, AND MANAGEMENT SYSTEM AND CONTROL METHOD THEREOF

(71) Applicant: SZ DJI TECHNOLOGY CO., LTD., Shenzhen (CN)

(72) Inventors: Lei Wang, Shenzhen (CN); Bogao Xu, Shenzhen (CN); Wentao Wang, Shenzhen (CN); Dayang Zheng, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 234 days.

(21) Appl. No.: 16/235,615

(22) Filed: Dec. 28, 2018

(65) Prior Publication Data

US 2019/0140325 A1    May 9, 2019

Related U.S. Application Data

(63) Continuation of application No. PCT/CN2016/088241, filed on Jul. 1, 2016.

(51) Int. Cl.
*G01R 31/50* (2020.01)
*H01M 10/48* (2006.01)
(Continued)

(52) U.S. Cl.
CPC .... *H01M 10/482* (2013.01); *G01R 19/16542* (2013.01); *G01R 31/382* (2019.01); *G01R 31/50* (2020.01); *H01M 10/425* (2013.01); *H01M 10/441* (2013.01); *H01M 10/48* (2013.01); *H01M 10/52* (2013.01); *H01M 10/54* (2013.01); *H01M 2010/4271* (2013.01)

(58) Field of Classification Search
CPC .... H01M 10/482; H01M 10/52; H01M 10/48; H01M 10/425; H01M 10/441; H01M 10/54; H01M 2010/4271; H01M 10/488; G01R 31/50; G01R 31/382; G01R 19/16542; G01R 31/52; G01R 31/3647; G01R 31/378; G01R 31/392; Y02E 60/10; Y02W 30/84
See application file for complete search history.

(56) References Cited

U.S. PATENT DOCUMENTS

2013/0156941 A1    6/2013 Xie
2018/0196107 A1*   7/2018 Fleischer ............. G01R 31/367

FOREIGN PATENT DOCUMENTS

CN    1821801 A    8/2006
CN    101460859 A   6/2009
(Continued)

OTHER PUBLICATIONS

Guangyuan Zheng et al., Interconnected hollow carbon nanospheres for stable lithium metal anodes, Nature Nanotechnology, Jul. 27, 2014, 6 pages, Macmillan Publishers Limited.
(Continued)

*Primary Examiner* — Son T Le
(74) *Attorney, Agent, or Firm* — Anova Law Group, PLLC

(57) ABSTRACT

A battery management system includes a detection circuit configured to detect an electrical parameter of a metal battery and a control circuit configured to determine a safety performance of a battery cell of the metal battery according to the electrical parameter.

18 Claims, 9 Drawing Sheets

(51) Int. Cl.
| | | |
|---|---|---|
| *H01M 10/52* | (2006.01) | |
| *G01R 31/382* | (2019.01) | |
| *G01R 19/165* | (2006.01) | |
| *H01M 10/42* | (2006.01) | |
| *H01M 10/44* | (2006.01) | |
| *H01M 10/54* | (2006.01) | |

(56) References Cited

FOREIGN PATENT DOCUMENTS

| | | | |
|---|---|---|---|
| CN | 102117937 | A | 7/2011 |
| CN | 202121011 | U | 1/2012 |
| CN | 102565611 | A | 7/2012 |
| CN | 103545564 | A | 1/2014 |
| CN | 105229483 | A | 1/2016 |
| JP | 2010277979 | A | 12/2010 |
| WO | 2016004320 | A3 | 4/2016 |

OTHER PUBLICATIONS

The World Intellectual Property Organization (WIPO) International Search Report for PCT/CN2016/088241 dated Mar. 1, 2017 8 Pages.

\* cited by examiner

METAL BATTERY, AND MANAGEMENT SYSTEM AND CONTROL METHOD THEREOF

CROSS-REFERENCE TO RELATED APPLICATION

This application is a continuation application of International Application No. PCT/CN2016/088241, filed on Jul. 1, 2016, the entire contents of which are incorporated herein by reference.

TECHNICAL FIELD

The present disclosure relates to metal battery technology and, more particularly, to a metal battery, a management system and control method thereof.

BACKGROUND

Lithium metal batteries were born earlier than lithium-ion batteries, and Moli corporation commercialized and sold more than 2 million lithium metal batteries in the 1980s. Due to the safety hazards of lithium metal batteries, several serious safety incidents had been caused and Moli was forced to recall a large number of batteries. Later the company went bankrupt and was acquired. One of the important safety hazards is the lithium dendrite growth at the negative electrode that causes the internal short circuit of the battery and the associated thermal failure risk. The birth of lithium-ion batteries is largely to solve the safety problems of lithium-metal batteries. By adding the layered material of deintercalated lithium-ion, such as graphite, to the negative electrode, non-uniform growth of lithium metal during charging that causes the formation of dendrites and other problems is solved. However, adding the layered material of deintercalated lithium-ion to the negative electrode cause a decrease of the volume ratio, the weight ratio, and the energy density of the battery cells. With the expansion of battery application fields, the demand for high-energy-density batteries has become increasingly strong. However, lithium-ion batteries have reached the theoretical upper limit of the energy density, which cannot meet the growing demand, especially in application fields, such as electric vehicles, unmanned aerial vehicles (UVs), and mobile phones. Therefore, metal batteries, such as lithium metal batteries, magnesium metal batteries, sodium metal batteries, or the like, have again caused widespread interest and product attempts.

In conventional technologies, in order to suppress or solve the dendrite growth, a solid porous membrane that cannot be easily pierced is used or a third electrode between the positive and negative electrodes is introduced to monitor the dendrite growth. However, the conventional methods for solving the dendrite growth problem increase the difficulty of manufacturing the battery or the cost of the material in varying degree and reduce the performance of the battery. For example, although the use of the solid porous membrane prevents dendrite piercing to a certain extent, the ionic conductivity of the solid membrane is generally lower than the ionic conductivity of liquid or colloidal electrolyte, and good interfaces are difficult to be formed between the solid membrane and the positive and negative electrodes, thus, the discharging capacity of the battery cells becomes weak and the cycle life is reduced. By introducing the third electrode between the positive and negative electrodes, the formation of lithium dendrites is monitored and a certain degree of intervention is chosen to perform, but the complexity of the internal structure of the battery is increased, and the existing production equipment and processes cannot be consistent with the complex internal structure. The introduction of the new electrode brings other potential failure risks, reduces the reliability of the battery cells, and inevitably leads to a decline in production yield. Moreover, in order to be consistent with the function of the third electrode, the battery management system also becomes complicated accordingly.

SUMMARY

In accordance with the disclosure, there is provided a battery management system includes a detection circuit configured to detect an electrical parameter of a metal battery and a control circuit configured to determine a safety performance of a battery cell of the metal battery according to the electrical parameter.

DESCRIPTION OF MAIN COMPONENTS AND LABELS

| | |
|---|---|
| battery management system (BMS) | 100 |
| detection circuit | 11 |
| control circuit | 12 |
| memory | 13 |
| indication unit | 14 |
| metal battery | 200, 200' |
| battery cell | 21 |
| cover | 22 |
| housing | 23 |

DETAILED DESCRIPTION OF THE EMBODIMENTS

Exemplary embodiments will be described with reference to the accompanying drawings.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "perpendicular," "horizontal," "left," "right," and similar expressions used herein are merely intended for description.

Unless otherwise defined, all the technical and scientific terms used herein have the same or similar meanings as generally understood by one of ordinary skill in the art. As described herein, the terms used in the specification of the present disclosure are intended to describe exemplary embodiments, instead of limiting the present disclosure. The term "and/or" used herein includes any suitable combination of one or more related items listed.

Technical solutions of the present disclosure will be described with reference to the drawings. It will be appreciated that the described embodiments are part rather than all of the embodiments of the present disclosure. Other embodiments conceived by those having ordinary skills in the art on the basis of the described embodiments without inventive efforts should fall within the scope of the present disclosure. In the situation where the technical solutions described in the embodiments are not conflicting, they can be combined.

Figure 1:
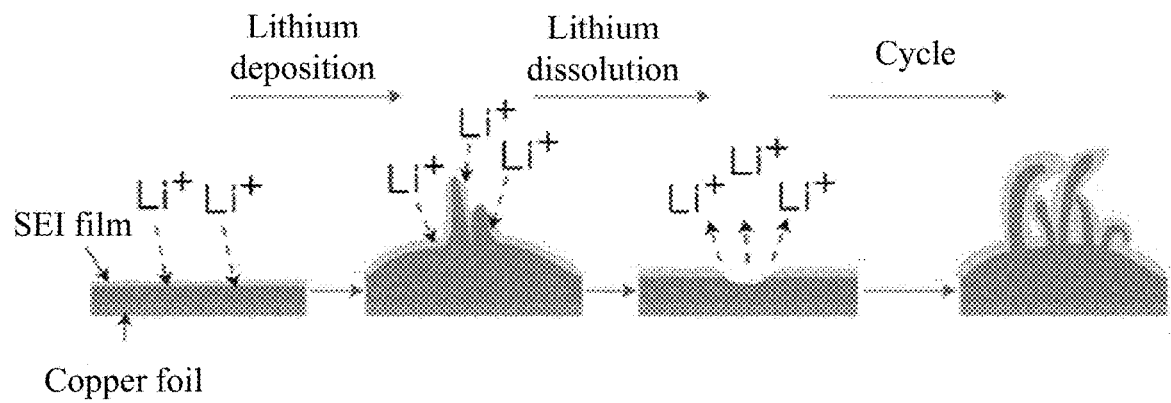
FIG. 1 schematically shows a formation process of a lithium dendrite inside a battery cell of a metal battery.
Figure 2:
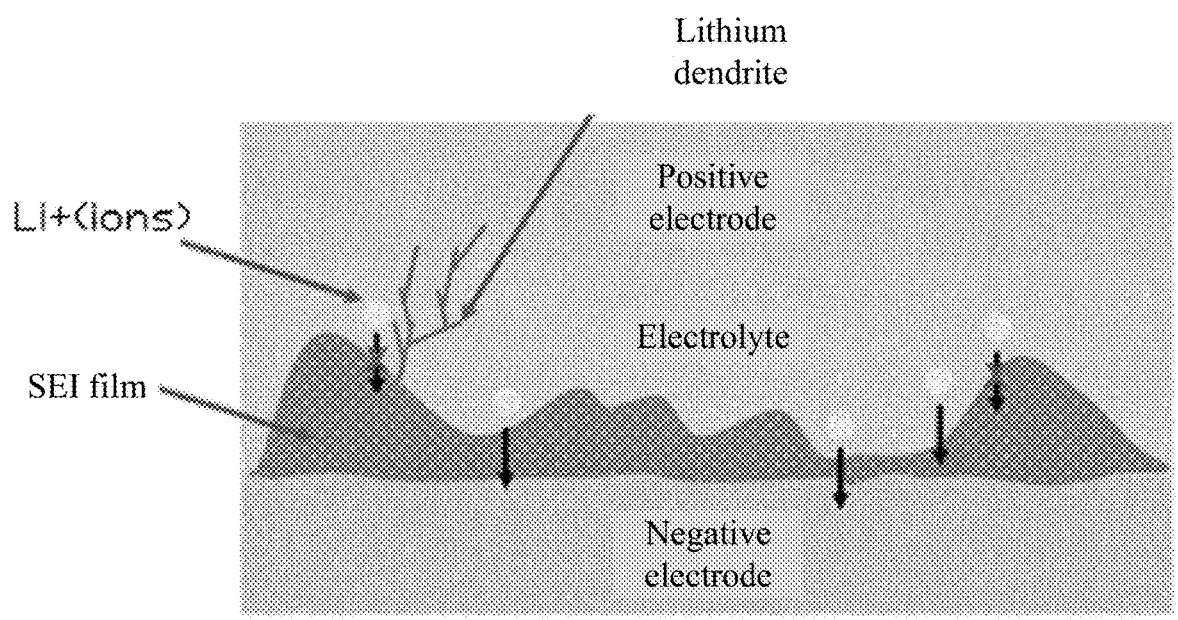
FIG. 2 schematically shows a short circuit between positive and negative electrodes of the battery cell of the metal battery induced by the formation of the lithium dendrite in FIG. 1.

The lithium dendrite growth inside a metal battery generally occurs during battery charging. FIG. 1 schematically shows an exemplary formation process of a lithium dendrite inside a battery cell of the metal battery. As shown in FIG. 1, taking a lithium metal battery as an example, due to uneven precipitation and growth of lithium metal on a negative electrode, lithium metal is deposited during a battery charging process, and a very thin solid electrolyte interface (SEI) film is quickly formed on the generated lithium metal surface. During the formation of lithium metal, the volume can swell that can cause damage to the SEI film. A dendritic dendrite can be formed over many cycles. A plurality of dendrites can be generated at different locations on the negative electrode surface inside the battery cell at the same time or at different times. FIG. 2 schematically shows a short circuit between the positive and negative electrodes of the battery cell of the metal battery induced by the formation of the lithium dendrite in FIG. 1. As shown in FIG. 2, as the dendrite grows, the dendrite finally pierces the membrane and reaches the positive electrode. As such, a local short circuit is formed inside the battery, which can cause a heat generation and even thermal runaway inside the battery that can induce irreversible serious failures, such as fire or even explosion.

Figure 3:
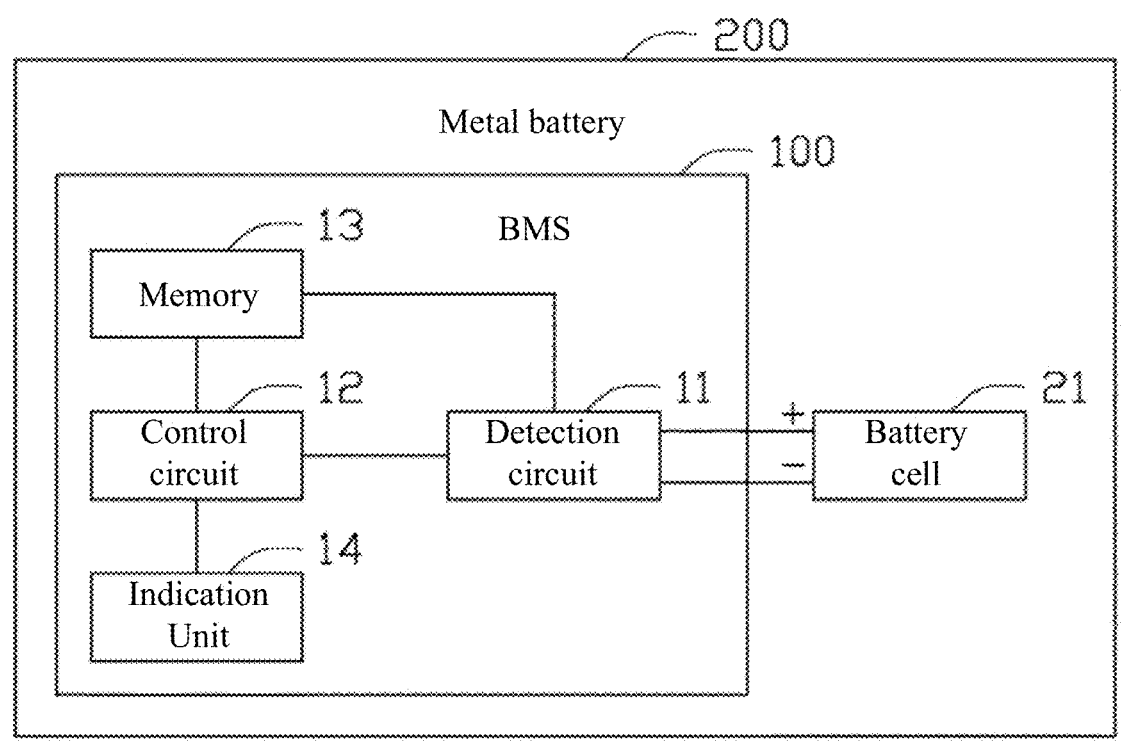
FIG. 3 is a schematic diagram of an application environment of a battery management system provided inside a housing of a metal battery according to the disclosure.

FIG. 3 is a schematic diagram of an exemplary application environment of a battery management system (BMS) 100 provided inside a housing of a metal battery 200 consistent with the disclosure. The BMS 100 is configured to manage one or more battery cells 21 of the metal battery 200 and to monitor a safety performance of the one or more battery cells 21 of the metal battery 200.

As shown in FIG. 3, the BMS 100 includes at least a detection circuit 11 and a control circuit 12. The detection circuit 11 can be configured to detect electrical parameters of the metal battery 200.

In some embodiments, as shown in FIG. 3, the BMS 100 is provided inside the housing of the metal battery 200, and the detection circuit 11 can be electrically connected to the one or more battery cells of the metal battery 200.

Figure 4:
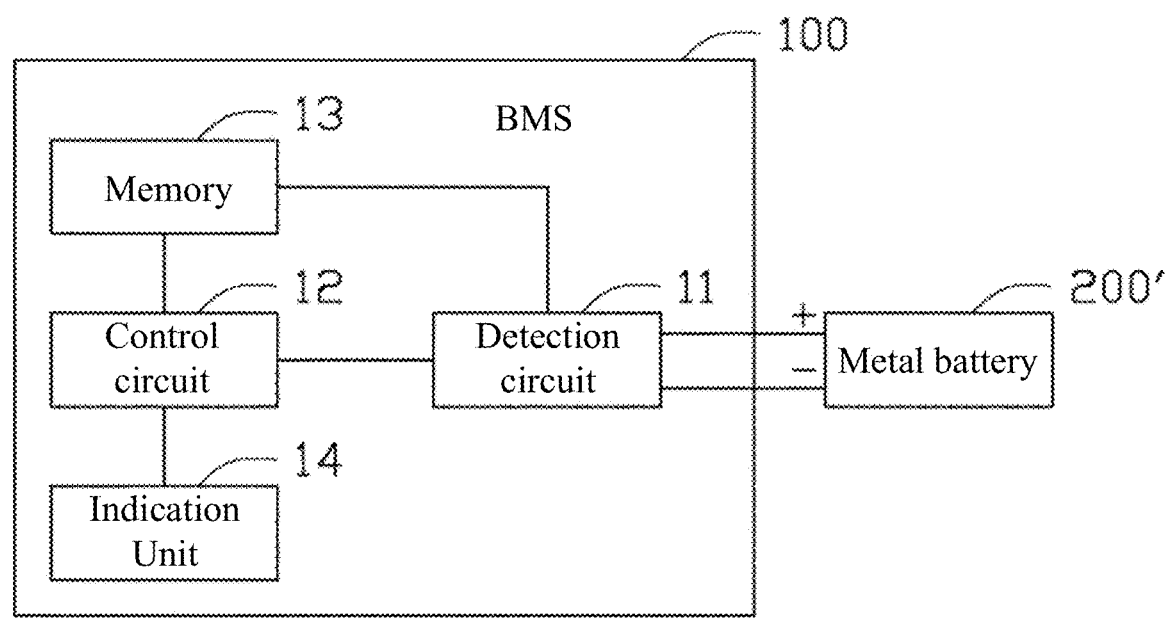
FIG. 4 is a schematic diagram of another application environment of a battery management system provided separately from a metal battery according to the disclosure.

FIG. 4 is a schematic diagram of another exemplary application environment of the BMS 100 provided separately from a metal battery 200 consistent with the disclosure. In some embodiments, as shown in FIG. 4, the BMS 100 is independent of the metal battery 200', and the detection circuit 11 can be electrically connected with the metal battery 200'.

The control circuit 12 can be configured to obtain the electrical parameters and determine the safety performance of the one or more battery cells 21 of the metal battery 200 according to the electrical parameters.

The control circuit 12 can include at least one of a microprocessor or a circuit comprising one or more circuit boards.

The detection circuit 11 can include at least one of a current detection circuit, a voltage detection circuit, or a voltameter (also called coulometer). The electrical parameters can include at least one of an energy of the metal battery, a capacity of the metal battery, a voltage of the metal battery, a current of the metal battery, energies of the one or more battery cells, capacities of the one or more battery cells, voltages of the one or more battery cells, or currents of the one or more battery cells.

The voltages can be directly detected by the voltage detection circuit. The currents can be directly detected by the current detection circuit. The capacities can be directly detected by the voltameter, or the currents can be firstly detected by the current detection circuit and the capacities can be calculated by integrating the currents over time. For the energies, the voltages can be detected by the voltage detection circuit, the currents can be detected by the current detection circuit, and the energies can be calculated by integrating products of the voltages and the currents over time.

For example, the detection circuit 11 can include the current detection circuit. The current detection circuit can be electrically connected to a charging circuit and/or a discharging circuit of the metal battery 200 and can be configured to detect charging currents in the charging circuit when the metal battery 200 is in a charging process and/or detect discharging currents in the discharging circuit when the metal battery 200 is in a discharging process.

In some embodiments, the control circuit 12 can calculate charging capacities during the charging process by integrating the charging currents over time, and/or calculate the discharging capacities during the discharging process by integrating the discharging currents over time.

In some embodiments, the detection circuit 11 can include the voltage detection circuit. The voltage detection circuit can be electrically connected between the positive and negative electrodes of the metal battery 200 or the one or more battery cells 21, and can be configured to detect charging voltages between the positive and negative electrodes of the metal battery 200 or the one or more battery cells during the charging process, detect discharging voltages between the positive and negative electrodes of the metal battery 200 or the one or more battery cells 21 during the discharging process, or detect resting voltages between the positive and negative electrodes of the metal battery 200 or the one or more battery cells 21 when the metal battery 200 is in a resting state.

In some embodiments, the detection circuit 11 can include the current detection circuit and the voltage detection circuit. The control circuit 12 can be configured to calculate charging energies by integrating the products of the charging currents and the charging voltages over time, and/or calculate discharging energies by integrating the products of the discharging currents and the discharging voltages over time.

In some embodiments, the detection circuit 11 can include the voltameter. The voltameter can be electrically connected to the charging circuit or the discharge circuit of the metal battery 200 and can be configured to detect the charging capacity of the metal battery 200 during the charging process or detect the discharging capacity of the metal battery 200 during the discharging process.

In some other embodiments, the voltameter can be electrically connected to the metal battery 200 or the one or more battery cells 21 and can be configured to detect the remaining capacity of the metal battery 200 when the metal battery 200 is in the resting state.

In some embodiments, the BMS 100 further includes a memory 13, and the memory 13 is electrically connected to the detection circuit 11 and the control circuit 12, respectively. The memory 13 can be configured to store the electrical parameters of the metal battery 200.

The control circuit 12 can be configured to obtain the electrical parameters of the metal battery 200 at different times from the memory 13 and determine the safety performance of the one or more battery cells 21 of the metal battery 200 according to the electrical parameters at the different times.

In some embodiments, the memory 13 can be also configured to store at least one preset value. The control circuit 12 can be configured to determine at least one change value of the electrical parameters of the metal battery 200 according to the electrical parameters at different times and determine the safety performance of the one or more battery cells 21 of the metal battery 200, according to at least one comparison result between the at least one change value and the at least one preset value.

The at least one change value can include a change rate, a change trend, or the like. The at least one preset value can be set as a maximum limit value or a minimum limit value of a normal variation range of the change rate, or a maximum limit value or a minimum limit value of a normal variation range of the change trend.

Figure 5:
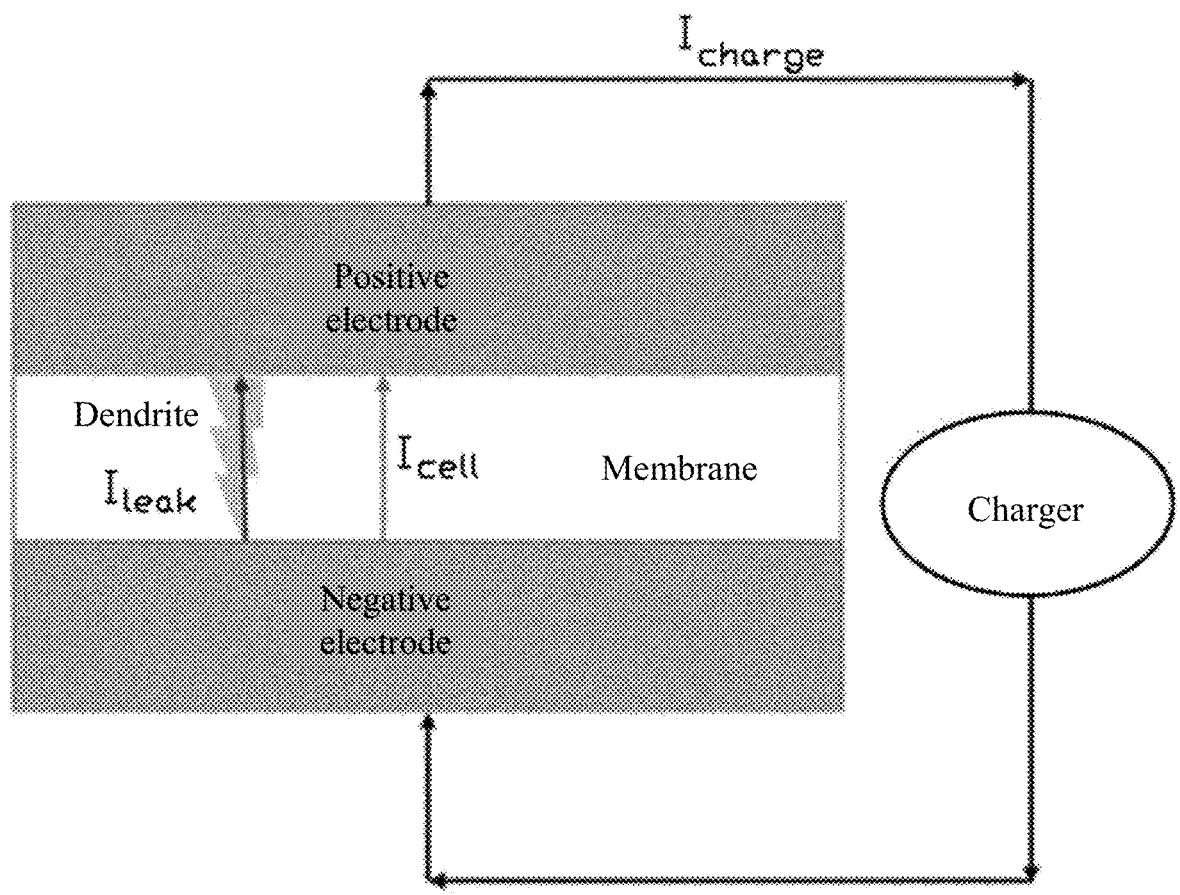
FIG. 5 schematically shows a battery cell of a metal battery in a charging state according to the disclosure.

Taking the metal battery 200 having one battery cell 21 as an example, FIG. 5 schematically shows the battery cell 21 of the metal battery 200 in a charging state. Because when the metal battery 200 is in the charging process, the dendrites can be formed inside the battery cell 21 and the positive and negative electrodes of the battery cell 21 can be connected by the dendrites to cause a short circuit, a large amount of the charging capacity or the charging energy can be consumed, such that relatively sharp transitions of the electrical parameters of the metal battery 200 and/or the battery cell 21 can be generated. For example, a large rising transition of the charging capacity or the charging energy of the metal battery 200 and/or the large rising transition of the charging capacity or the charging energy of the battery cell 21 can be generated, or a large rising transition or a falling transition of the charging voltage or the charging current of the metal battery 200 and/or the large rising transition or the falling transition of the charging voltage or the charging current of the battery cell 21 can be generated. The BMS 100 can monitor the formation of dendrites during the charging of the metal battery 200 according to the above-described situations.

In some embodiments, the control circuit 12 can determine at least one change rate of the electrical parameters of the metal battery 200 in the charging state according to at least one of the electrical parameters of the metal battery 200 at different times and determine the safety performance of the battery cell 21 of the metal battery 200 according to at least one comparison result between the at least one change rate and the at least one preset value.

When the metal battery 200 is in the charging process, the charging capacity of the metal battery 200 can be calculated by integrating the charging current over time. The formula for calculating the charging capacity of the metal battery 200 can be expressed as:

$$Q_{charge} = \int I_{charge} dt$$

where $Q_{charge}$ denotes the charging capacity and the unit of $Q_{charge}$ can be mAh or Ah, and $I_{charge}$ denotes the charging current and the unit of $I_{charge}$ can be mA or A.

The charging energy of the metal battery 200 can be calculated by integrating the product of the charging voltage and the charging current over time during the charging process. The formula for calculating the charging energy of the metal battery 200 can be expressed as:

$$W_{charge} = \int U_{charge} I_{charge} dt$$

where $W_{charge}$ denotes the charging energy and the unit of $W_{charge}$ can be Wh or mWh, and $U_{charge}$ denotes the charging voltage and the unit of $U_{charge}$ can be mV or V.

Inside the metal battery 200, the current actually used by the battery cell 21 of the metal battery 200 to generate electricity is $I_{cell}$, and the actual charging capacity of the metal battery 200 is $Q_0$. The calculation formula of the charging capacity $Q_0$ actually generated by the battery cell 21 of the metal battery 200 can be expressed as:

$$Q_0 = \int I_{cell} dt$$

If dendrites are formed inside the battery cell 21 of the metal battery 200, a dendrite leakage-current is $I_{leak}$, the charging current $I_{charge} = I_{leak} + I_{cell}$, and the charging voltage $U_{charge} = U_{cell} = I_{cell} \cdot R_{cell}$, where $R_{cell}$ is a resistance of the batter cell 21.

A calculation formula for a capacity $Q_{leak}$ consumed by the dendrites can be expressed as:

$$Q_{leak} = \int I_{leak} dt$$

and $Q_{charge} = Q_{leak} + Q_0$.

An energy $W_{leak}$ consumed by the dendrites can be expressed as:

$$W_{leak} = \int U_{leak} I_{leak} dt$$

where $W_{charge} = W_{leak} + W_0$, $W_0$ is an actual charging energy of the metal battery 200.

The charging currents at different times T1 and T2 are set as $I_{T2}$ and $I_{T1}$, respectively, where T2>T1 (T2 is a later time point than T1) and a time interval $\Delta t = T2 - T1$, thus a change rate $v_i$ of the charging current $I_{charge}$ can be expressed as:

$$v_i = \Delta I_{charge}/\Delta t = |I_{T2} - I_{T1}|/\Delta t$$

when $I_{T2} > I_{T1}$, the change rate $v_i$ can be an increase rate of the charging current $I_{charge}$, and when $I_{T2} < I_{T1}$, the change rate $v_i$ can be a decrease rate of the charging current $I_{charge}$.

The charging voltages at different times T1 and T2 are set as $U_{T2}$ and $U_{T1}$, respectively, and a change rate $v_u$ of the charging voltage $U_{charge}$ can be expressed as:

$$v_u = \Delta U_{charge}/\Delta t = |U_{T2} - U_{T1}|/\Delta t$$

when $U_{T2} > U_{T1}$, the change rate $v_u$ can be an increase rate of the charging voltage $U_{charge}$, and when $U_{T2} < U_{T1}$, the change rate $v_u$ can be a decrease rate of the charging voltage $U_{charge}$.

The charging capacity at different times T1 and T2 are set as $Q_{T2}$ and $Q_{T1}$, respectively, and a change rate $v_q$ of the charging capacity $Q_{charge}$ can be expressed as:

$$v_q = \Delta Q_{charge}/\Delta t = |Q_{T2} - Q_{T1}|/\Delta t$$

when $Q_{T2} > Q_{T1}$, the change rate $v_q$ can be an increase rate of the charging capacity $Q_{charge}$, and when $Q_{T2} < Q_{T1}$, the change rate $v_q$ can be a decrease rate of the charging capacity $Q_{charge}$.

The charging energy at different times T1 and T2 are set as $W_{T2}$ and $W_{T1}$, respectively, and a change rate $v_w$ of the charging energy $W_{charge}$ can be expressed as:

$$v_w = \Delta W_{charge}/\Delta t = |W_{T2} - W_{T1}|/\Delta t$$

when $W_{T2} > W_{T1}$, the change rate $v_w$ can be an increase rate of the charging energy $W_{charge}$, and when $W_{T2} < W_{T1}$, the change rate $v_w$ can be a decrease rate of the charging energy $W_{charege}$.

In some embodiments, the electrical parameters can include the charging current of the metal battery 200 and/or the charging current of the battery cell 21.

The control circuit 12 can determine the increase rate of the charging current, according to a difference of the charging currents at different times, when the metal battery 200 is in a constant voltage charging state. When the increase rate of the charging current is greater than the preset value, it can be determined that the dendrites are formed inside the battery cell 21 of the metal battery 200 and the positive and negative electrodes of the battery cell 21 are connected by the dendrites.

In the constant voltage charging process, because the charging voltage $U_{charge}$ remains substantially unchanged, the current of the battery cell $I_{cell}$ also remains unchanged.

If the positive and negative electrodes of the battery cell 21 are connected by the dendrites to cause the internal short circuit in the battery cell 21, the dendrite leakage-current $I_{leak}$ can become a short-circuit current and becomes a very large value.

A preset value $P_{I1}$ can be set as the maximum limit value of the change rate of the charging current $I_{charege}$ within the normal variation range. According to the above description, the increase of the dendrite leakage-current $I_{leak}$ can cause the rising transition of the charging current $I_{charge}$, such that the increase rate $v_i$ of the charging current $I_{charge}$ can be greater than the preset value $P_{I1}$. Therefore, it can be determined that the dendrites are formed inside the battery cell 21 of the metal battery 200 and the positive and negative electrodes of the battery cell 21 are connected by the dendrites.

In some embodiments, the electrical parameters can include the charging capacity and/or the charging energy of the metal battery 200 and/or the charging capacity and/or the charging energy of the battery cell 21.

The control circuit 12 can determine the increase rate of the charging capacity and/or the increase rate of the charging energy, according to a difference of the charging capacities and/or a difference of the charging energies at different times, when the metal battery 200 is in the constant voltage charging state. When the increase rate of the charging capacity and/or the increase rate of the charging energy are greater than the corresponding preset values, it can be determined that the dendrites are formed inside the battery cell 21 of the metal battery 200 and the positive and negative electrodes of the battery cell 21 are connected by the dendrites.

A preset value $P_{Q1}$ can be set as the maximum limit value of the change rate of the charging capacity $Q_{charge}$ within the normal variation range. According to the above description, the increase of the dendrite leakage-current Leak can cause an increase of the capacity $Q_{leak}$ costed by the dendrites and the rising transition of the charging current $I_{charge}$, such that a rising transition of the charging capacity $Q_{charge}$ can be generated. Therefore, the increase rate $v_q$ of the charging capacity $Q_{charge}$ can be greater than the preset value $P_{Q1}$, and it can be determined that the dendrites are formed inside the battery cell 21 of the metal battery 200 and the positive and negative electrodes of the battery cell 21 are connected by the dendrites.

A preset value $P_{W1}$ can be set as the maximum limit value of the change rate of the charging energy $W_{charge}$ within the normal variation range. According to the above description, the increase of the dendrite leakage-current Leak can cause an increase of an energy $W_{leak}$ costed by the dendrites, such that a rising transition of the charging energy $W_{charge}$ can be generated. Therefore, the increase rate $v_W$ of the charging energy $W_{charge}$ can be greater than the preset value $P_{W1}$, and it can be determined that the dendrites are formed inside the battery cell 21 of the metal battery 200 and the positive and negative electrodes of the battery cell 21 are connected by the dendrites.

In some embodiments, the electrical parameters can include the charging voltage of the metal battery 200 and/or the charging voltage of the battery cell 21.

The control circuit 12 can determine the decrease rate of the charging voltage, according to a difference of the charging voltages at different times, when the metal battery 200 is in a constant current charging state. When the decrease rate of the charging voltage is greater than the preset value, it can be determined that the dendrites are formed inside the battery cell 21 of the metal battery 200 and the positive and negative electrodes of the battery cell 21 are connected by the dendrites.

In the constant current charging process, because the charging current $I_{charge}$ remains substantially unchanged, the voltage of the battery cell $U_{cell}$ can gradually decrease in normal situations.

A preset value $P_{U1}$ can be set as the maximum limit value of the change rate of the charging voltage $U_{charge}$ within the normal variation range. According to the above description, the increase of the dendrite leakage-current $I_{leak}$ can cause a falling transition of the current of the battery cell $I_{cell}$ and a falling transition of the charging voltage $U_{charge}$, such that the decrease rate $v_u$ of the charging voltage $U_{charge}$ can be greater than the preset value $P_{U1}$. Therefore, it can be determined that the dendrites are formed inside the battery cell 21 of the metal battery 200 and the positive and negative electrodes of the battery cell 21 are connected by the dendrites.

In some embodiments, the electrical parameters can include the charging energy of the metal battery 200 and/or the charging energy of the battery cell 21.

The control circuit 12 can determine the increase rate of the charging energy, according to the difference of the charging energies at different times, when the metal battery 200 is in a constant current charging state. When the increase rate of the charging energy is less than the preset value, it can be determined that the dendrites are formed inside the battery cell 21 of the metal battery 200 and the positive and negative electrodes of the battery cell 21 are connected by the dendrites.

A preset value $P_{W2}$ can be set as the minimum limit value of the change rate of the charging energy $W_{charge}$ within the normal variation range. According to the above description, the charging current $I_{charge}$ remains substantially unchanged in the constant current charging process, and the increase of the dendrite leakage-current $I_{leak}$ can cause the falling transition of the charging voltage $U_{charge}$, such that the increase rate of the charging energy $W_{charge}$ can be slowed down, causing the decrease rate $v_{W2}$ of the charging energy $W_{charge}$ to be less than the preset value $P_{W2}$. Hence, it can be determined that the dendrites are formed inside the battery cell 21 of the metal battery 200 and the positive and negative electrodes of the battery cell 21 are connected by the dendrites.

In the constant current charging process, because the charging current $I_{charge}$ remains substantially unchanged, the charging capacity $Q_{charge}$ can increase as a normal speed. That is, the change rate of the charging capacity $Q_{charge}$ can be within the normal variation range.

Figure 6:
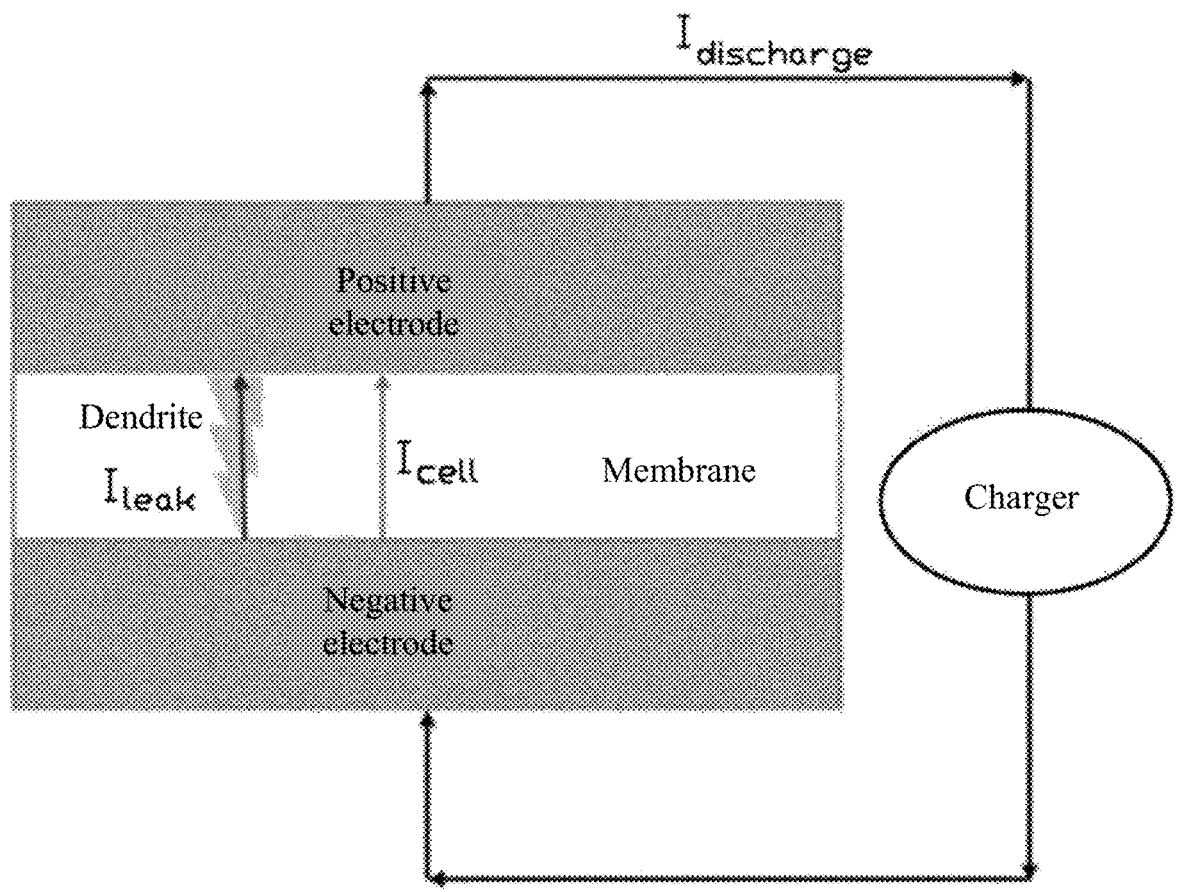
FIG. 6 schematically shows a battery cell of a metal battery in a discharging state according to the disclosure.

FIG. 6 schematically shows the battery cell 21 of the metal battery 200 in a discharging state consistent with the disclosure. Because when the metal battery 200 is in the discharging process, the dendrites can also be formed inside the battery cell 21 and the positive and negative electrodes of the battery cell 21 can be connected by the dendrites to cause the short circuit, a large amount of the discharging capacity or the discharging energy can be consumed, such that the relatively sharp transitions of the electrical parameters of the metal battery 200 and/or the battery cell 21 can be generated. For example, a large falling transition of the discharging capacity or the discharging energy of the metal battery 200 and/or the large falling transition of the discharging capacity or the discharging energy of the battery cell 21 can be generated, or a large rising transition or a falling transition of the discharging voltage or the discharging current of the metal battery 200 and/or the large rising transition or the falling transition of the discharging voltage or the discharging current the battery cell 21 can be generated. The BMS 100 can monitor the formation of dendrites during the discharging of the metal battery 200 according to the above-described situations.

In some embodiments, the control circuit 12 can determine at least one change rate of the electrical parameters of the metal battery 200 in the discharging state, according to at least one of the electrical parameters of the metal battery 200 at different times, and determine the safety performance of the battery cell 21 of the metal battery 200, according to at least one comparison result between the at least one change rate and the at least one preset value.

When the metal battery 200 is in the discharging process, inside the metal battery 200, the current actually used by the battery cell 21 of the metal battery 200 to generate electricity is Len and the actual discharging capacity of the metal battery 200 is $Q_{d0}$. The formula for calculating the actual discharging capacity $Q_{d0}$ of the metal battery 200 can be expressed as:

$$Q_{d0} = \int I_{cell} dt$$

The discharging capacity of the metal battery 200 can be calculated by integrating the discharging current over time during the discharging process. The formula for calculating the discharging capacity of the metal battery 200 can be expressed as:

$$Q_{discharge} = \int I_{discharge} dt$$

where $Q_{discharge}$ denotes the discharging capacity and the unit of $Q_{discharge}$ can be mAh or Ah, and $I_{discharge}$ denoted the discharging current and the unit of $I_{discharge}$ can be mA or A.

The discharging energy of the metal battery 200 can be calculated by integrating the product of the discharging voltage and the discharging current over time during the discharging process. The formula for calculating the discharging energy of the metal battery 200 can be expressed as:

$$W_{discharge} = \int U_{discharge} I_{discharge} dt$$

where $W_{discharge}$ denotes the discharging energy and the unit of $W_{discharge}$ can be Wh or mWh, and $U_{discharge}$ denotes the discharging voltage and the unit of $U_{discharge}$ can be mV or V.

If dendrites are formed inside the battery cell 21 of the metal battery 200, the discharging current $I_{discharge}=I_{leak}-I_{cell}$, and the discharging voltage $U_{discharge}=U_{cell}-I_{cell}R_{cell}$, the discharging capacity $Q_{discharge}=Q_{d0}-Q_{leak}$, and the discharging energy $W_{discharge}=W_{d0}-W_{leak}$.

The discharging currents at different times T1 and T2 are set as $I_{dT2}$ and $I_{dT1}$, respectively, where T2>T1 and the time interval $\Delta t=T2-T1$, thus, a change rate $v_{di}$ of the discharging current $I_{discharge}$ can be expressed as:

$$v_{di} = \Delta I_{discharge}/\Delta t = |I_{dT2}-I_{dT1}|/\Delta t$$

when $I_{dT2}>I_{dT1}$, the change rate $v_{di}$ can be an increase rate of the discharging current $I_{discharge}$, and when $I_{dT2}<I_{dT1}$, the change rate $v_{di}$ can be a decrease rate of the discharging current $I_{discharge}$.

The discharging voltages at different times T1 and T2 are set as $U_{dT2}$ and $U_{dT1}$, respectively, thus, a change rate $v_{du}$ of the discharging voltage $U_{discharge}$ can be expressed as:

$$v_{du} = \Delta U_{discharge}/\Delta t = |U_{dT2}-U_{dT1}|/\Delta t$$

when $U_{dT2}>U_{dT1}$, the change rate vdu can be an increase rate of the discharging voltage $U_{discharge}$, and when $U_{dT2}<U_{dT1}$, the change rate vdu can be a decrease rate of the discharging voltage $U_{discharge}$.

The discharging capacities at different times T1 and T2 are set as $Q_{dT2}$ and $Q_{dT1}$, respectively, thus, a change rate $v_{dq}$ of the discharging capacity $Q_{discharge}$ can be expressed as:

$$v_{dq} = \Delta Q_{discharge}/\Delta t = |Q_{dT2}-Q_{dT1}|/\Delta t$$

when $Q_{dT2}>Q_{dT1}$, the change rate $v_{dq}$ can be an increase rate of the discharging capacity $Q_{discharge}$, and when $Q_{dT2}<Q_{dT1}$, the change rate $v_{dq}$ can be a decrease rate of the discharging capacity $Q_{discharge}$.

The discharging energies at different times T1 and T2 are set as $W_{dT2}$ and $W_{dT1}$, respectively, thus, a change rate $v_{dw}$ of the discharging energy $W_{discharge}$ can be expressed as:

$$v_{dw} = \Delta W_{discharge}/\Delta t = |W_{dT2}-W_{dT1}|/\Delta t$$

when $W_{dT2}>W_{dT1}$, the change rate yaw can be an increase rate of the discharging energy $W_{discharge}$, and when $W_{dT2}<W_{dT1}$, the change rate yaw can be a decrease rate of the discharging energy $W_{discharge}$.

In some embodiments, the electrical parameters can include the discharging current of the metal battery 200 and/or the discharging current of the battery cell 21.

The control circuit 12 can determine a decrease rate of the discharging current, according to a difference of the discharging currents at different times, when the metal battery 200 is in the discharging state. When the decrease rate of the discharging current is greater than the preset value, it can be determined that the dendrites are formed inside the battery cell 21 of the metal battery 200 and the positive and negative electrodes of the battery cell 21 are connected by the dendrites.

In the discharging process, inside the metal battery 200, the current $I_{cell}$ actually used by the battery cell 21 of the metal battery 200 to generate electricity can gradually decrease in normal situations.

A preset value $P_{I2}$ can be set as the maximum limit value of the change rate of the discharging current $I_{discharge}$ within the normal variation range. According to the above description, the increase of the dendrite leakage-current $I_{leak}$ can cause a falling transition of the discharging current $I_{discharge}$, such that the decrease rate $v_{di}$ of the discharging current $I_{discharge}$ can be greater than the preset value $P_{I2}$. Therefore, it can be determined that the dendrites are formed inside the battery cell 21 of the metal battery 200 and the positive and negative electrodes of the battery cell 21 are connected by the dendrites.

In addition, as described above, in the discharging process, the current $I_{cell}$ actually used by the battery cell 21 of the metal battery 200 to generate electricity can gradually decrease in normal situations. According to the above description, the discharging voltage $U_{discharge}$ can also gradually decrease at a normal speed. That is, the change rate $v_{du}$ of the discharging voltage $U_{discharge}$ can be within the normal variation range.

In some embodiments, the electrical parameters can include the discharging capacity and/or the discharging energy of the metal battery 200 and/or the discharging capacity and/or the discharging energy of the battery cell 21.

The control circuit 12 can determine the increase rate of the discharging capacity and/or the increase rate of the discharging energy, according to a difference of the discharging capacities and/or a difference of the discharging energies at different times, when the metal battery 200 is in the discharging state. When the increase rate of the discharging capacity and/or the increase rate of the discharging energy are less than the corresponding preset values, it can be determined that the dendrites are formed inside the battery cell 21 of the metal battery 200 and the positive and negative electrodes of the battery cell 21 are connected by the dendrites.

A preset value $P_{Q3}$ can be set as the minimum limit value of the change rate the discharging capacity $Q_{discharge}$ within the normal variation range. According to the above description, the increase of the dendrite leakage-current $I_{leak}$ can cause an increase of the capacity $Q_{leak}$ costed by the dendrites and the falling transition of the discharging current $I_{discharge}$, such that the increase rate of the discharging capacity $Q_{discharge}$ can be slowed down, causing the increase rate $v_{dq}$ of the discharging capacity $Q_{discharge}$ to be less than the present value $P_{Q3}$. Therefore, it can be determined that the dendrites are formed inside the battery cell 21 of the metal battery 200 and the positive and negative electrodes of the battery cell 21 are connected by the dendrites.

A preset value $P_{W3}$ can be set as the minimum limit value of the change rate of the discharging energy $W_{discharge}$ within the normal variation range. According to the above description, the increase of the dendrite leakage-current $I_{leak}$ can cause the falling transition of the discharging current $I_{discharge}$, a slow decrease of the discharging voltage $U_{discharge}$ at the normal speed, and an increase of the energy $W_{leak}$ costed by the dendrites, such that the increase rate $v_{dw}$ of the discharging energy $W_{discharge}$ can be less than the preset value $P_3$. Therefore, it can be determined that the dendrites are formed inside the battery cell 21 of the metal battery 200 and the positive and negative electrodes of the battery cell 21 are connected by the dendrites.

Figure 7:
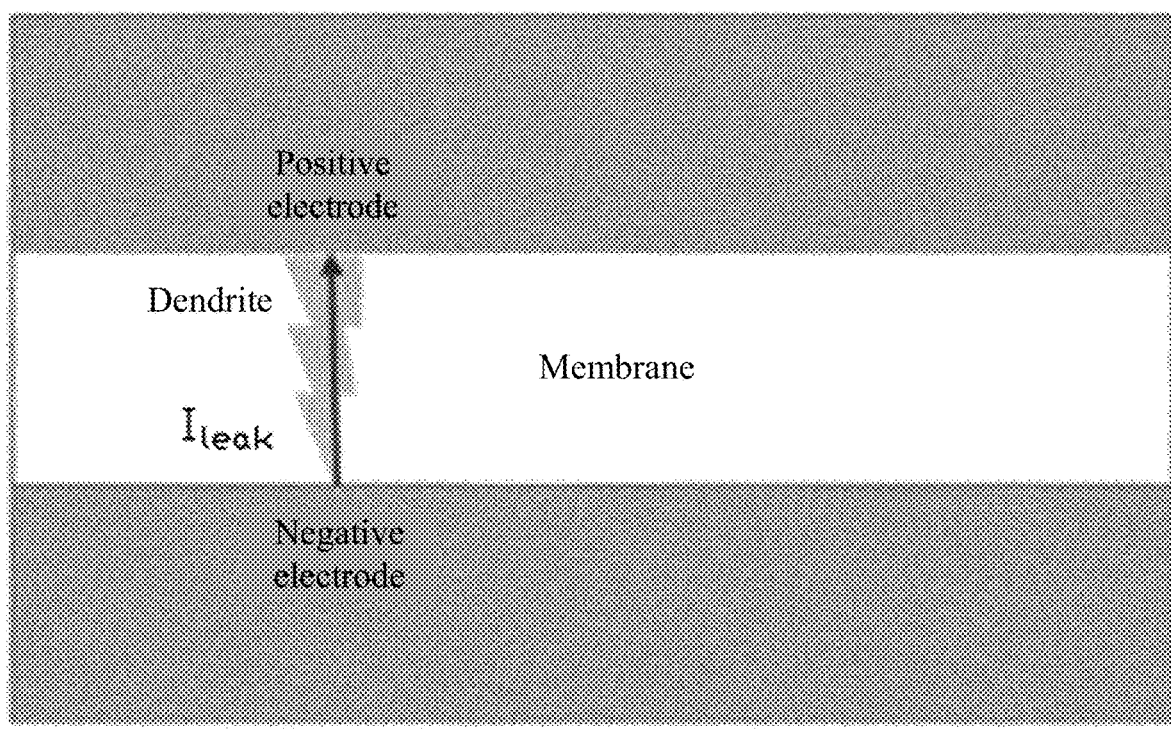
FIG. 7 schematically shows a battery cell of a metal battery in a resting state according to the disclosure.

FIG. 7 schematically shows the battery cell 21 of the metal battery 200 in a resting state consistent with the disclosure. Because when the metal battery 200 is in the resting state, i.e., a non-charging and non-discharging state, the dendrites can also be formed inside the battery cell 21 due to internal or external extrusions, hits, or the like, and the positive and negative electrodes of the battery cell 21 can be connected by the dendrites to cause the short circuit, a large amount of capacity can be consumed, such that the relatively sharp transitions of the electrical parameters of the metal battery 200 and/or the battery cell 21 can be generated.

For example, a large falling transition of a remaining capacity of the metal battery 200 and/or the large falling transition of the remaining capacity of the battery cell 21 can be generated, or a large falling transition of a resting voltage of the metal battery 200 and/or the large falling transition of the resting voltage of the battery cell 21 can be generated. The BMS 100 can monitor the formation of dendrites in the metal battery 200 during the rest state according to the above-described situations.

In some embodiments, the control circuit 12 can determine at least one change rate of the electrical parameters of the metal battery 200 in the resting state, according to at least one of the electrical parameters of the metal battery 200 at different times, and determine the safety performance of the battery cell 21 of the metal battery 200 according to at least one comparison result between the at least one change rate and the at least one preset value.

When the metal battery 200 is in the resting state, in normal situations, the resting voltage $U_{+-}$ between the positive and negative electrodes of the battery cell 21 gradually decreases, the remaining capacity $Q_r$ in the resting state also gradually decreases, and $Q_r=Q_t-Q_{leak}$, where $Q_t$ denotes a total capacity in the resting state.

The resting voltages at different times T1 and T2 are set as $U_{rT2}$ and $U_{rT1}$, respectively, thus, a change rate $v_{ru}$ of the resting voltage $U_{+-}$ can be expressed as:

$$V_{du}=\Delta U_{+-}/\Delta t=|U_{rT2}-U_{rT1}|/\Delta t$$

The remaining capacities at different times T1 and T2 are set as $Q_{rT2}$ and $Q_{rT1}$, respectively, thus, a change rate $v_{rq}$ of the remaining capacity $Q_r$ can be expressed as:

$$v_{rq}=\Delta Q_r/\Delta t=|Q_{rT2}-Q_{rT1}|/\Delta t$$

In some embodiments, the electrical parameters can include the resting voltage and/or the remaining capacity of the metal battery 200 and/or the resting voltage and/or the remaining capacity of the battery cell 21.

The control circuit 12 can determine the decrease rate of the resting voltage and/or the decrease rate of the remaining capacity, according to a difference of the resting voltages and/or a difference of the remaining capacities at different times, when the metal battery 200 is in the resting state. When the decrease rate of the resting voltage and/or the decrease rate of the remaining capacity is greater than the corresponding preset value, it can be determined that the dendrites are formed inside the battery cell 21 of the metal battery 200 and the positive and negative electrodes of the battery cell 21 are connected by the dendrites.

A preset value $P_{U3}$ can be set as the maximum limit value of the change rate of the resting voltage $U_{+-}$ within the normal variation range. According to the above description, the short circuit induced by the positive and negative electrodes of the battery cell 21 connected by the dendrites can cause the falling transition of the resting voltage $U_{+-}$, such that the decrease rate $v_{rq}$ of the resting voltage $U_{+-}$ can be greater than the preset value $P_{U3}$. Therefore, it can be determined that the dendrites are formed inside the battery cell 21 of the metal battery 200 and the positive and negative electrodes of the battery cell 21 are connected by the dendrites.

A preset value $P_{Q4}$ can be set as the maximum limit value of the change rate of the remaining capacity $Q_r$ within the normal variation range. According to the above description, the increase of the dendrite leakage-current $I_{leak}$ can cause the increase of the capacity $Q_{leak}$ costed by the dendrites, such that the falling transition of the remaining capacity $Q_r$ can be generated, causing the decrease rate $v_{rq}$ of the remaining capacity $Q_r$ to be greater than the preset value $P_{Q4}$. Hence, it can be determined that the dendrites are formed inside the battery cell 21 of the metal battery 200 and the positive and negative electrodes of the battery cell 21 are connected by the dendrites.

Figure 8:
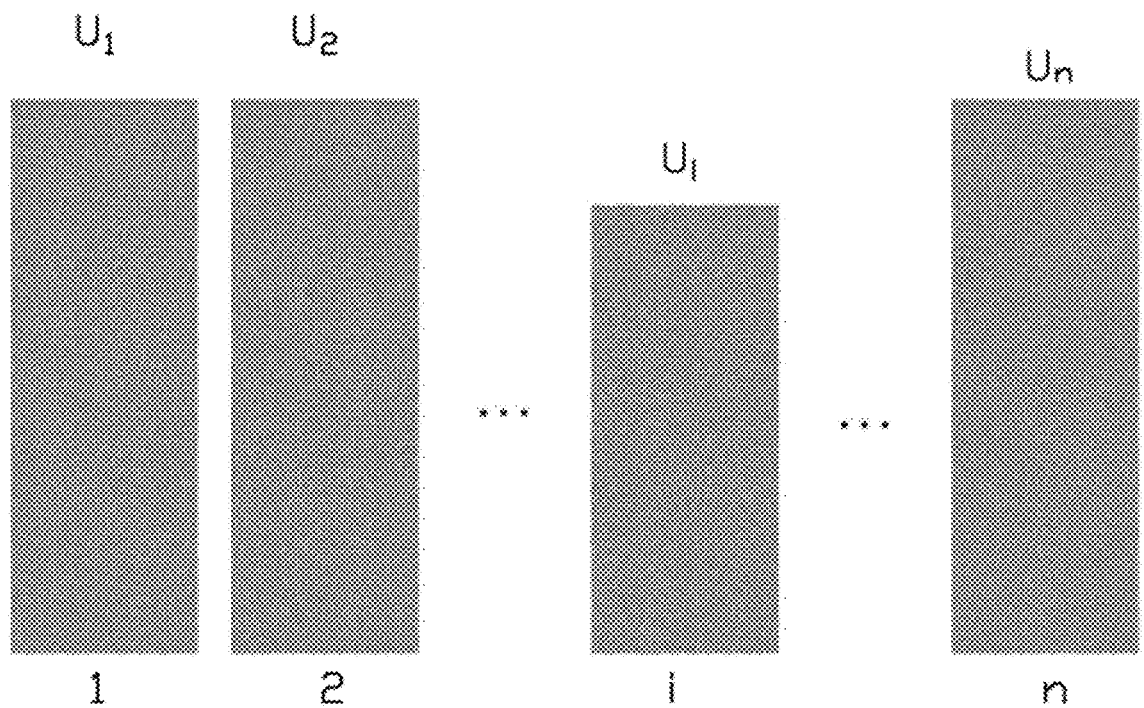
FIG. 8 schematically shows a plurality of battery cells of a metal battery in a resting state according to the disclosure.

FIG. 8 schematically shows a plurality of battery cells 21 of the metal battery 200 in the resting state consistent with the disclosure. The metal battery 200 can include the plurality of battery cells 21 connected in series and/or in parallel.

In some embodiments, the memory 13 can be configured to store the electrical parameters of the plurality of battery cells 21 of the metal battery 200. The control circuit 12 can be configured to obtain the electrical parameters of the plurality of battery cells 21 of the metal battery 200 at a same time from the memory 13 and determine the safety performance of the plurality of battery cells 21 of the metal battery 200 according to the electrical parameters at the same time.

In some embodiments, the electronic parameters can include the resting voltages of the plurality of battery cells 21. The control circuit 12 can be configured to determine resting voltage differences between each two of the plurality of battery cells 21, according to the resting voltages of the plurality of battery cells 21 of the metal battery 200 at the same moment in the resting state, and determine a maximum value of the resting voltage differences between each two of the plurality of battery cells 21. The safety performance of the plurality of battery cells 21 of the metal battery 200 can be determined according to a comparison result between the maximum value of the resting voltage differences between each two of the plurality of battery cells 21 and the preset value.

Furthermore, when the maximum value of the resting voltage differences between each two of the plurality of battery cells 21 is greater than the preset value, the control circuit can determine that the dendrites are formed inside at least one of the plurality of battery cells 21 of the metal battery 200 and the positive and negative electrodes of at least one of the plurality of battery cells 21 are connected by the dendrites.

In some embodiments, the maximum value of the resting voltage differences, also referred to as a maximum resting voltage difference, between each two of the plurality of battery cells 21 can be expressed as:

$$\Delta U = \max\{U_i - U_j\}, i \neq j, 1 \leq i,j \leq n$$

where n denotes the number of the plurality of battery cells 21 of the metal battery 200.

In normal situations, the differences between the resting voltage differences between each two of the plurality of battery cells 21 are not too great.

A preset value $P_{U4}$ can be set as the maximum limit value of the maximum value $\Delta U$ of the resting voltage differences within the normal variation range. The short circuit induced by the positive and negative electrodes of at least one of the plurality of battery cells 21 connected by the dendrites can cause the falling transition of the resting voltage $U_{+-}$, such that the maximum value $\Delta U$ of the resting voltage differences can be greater than the preset value $P_{U4}$. Therefore, it can be determined that the dendrites are formed inside at least one of the plurality of battery cells 21 of the metal battery 200 and the positive and negative electrodes of at least one of the plurality of battery cells 21 are connected by the dendrites.

The BMS 100 can timely and effectively discover the formation of the dendrites by using the methods described above, such that the safety measures can be performed in time and the safety accidents can be avoided.

In some embodiments, the electronic parameters can include a total charging capacity and/or a total charging energy in a complete charging process from zero charge to full charge.

When a difference between two adjacent total charging capacities and/or a difference between two adjacent total charging energies are greater than the corresponding preset values, the control circuit 12 can determine that the dendrites are formed inside the one or more battery cells 21 of the metal battery 200 and the positive and negative electrodes of the one or more battery cells 21 are connected by the dendrites.

In normal situations, the difference between two adjacent total charging capacities and/or the difference between two adjacent total charging energies are not too great in the complete charging process from zero charge to full charge.

The two adjacent total charging capacities are set as $Q_2$ and $Q_1$ respectively, thus the difference $\Delta Q_{charge}$ between two adjacent total charging capacities can be expressed as:

$$\Delta Q_{charge} = |Q_2 - Q_1|$$

The two adjacent total charging energies are set as $W_2$ and $W_1$ respectively, thus the difference $\Delta_{charge}$ between two adjacent total charging energies can be expressed as:

$$\Delta W_{charge} = |W_2 - W_1|$$

A preset value $P_{Q5}$ can be set as the maximum limit value of the difference of the two adjacent total charging capacities within the normal variation range. Because the total charging capacity $Q_{charge} = Q_{leak} + Q_0$, when the positive and negative electrodes of the one or more battery cells 21 are connected by the dendrites, the capacity $Q_{leak}$ costed by the dendrites can increase significantly, such that a rising transition of the total charging capacity $Q_{charge}$ can be generated, causing the difference $\Delta Q_{charge}$ of the two adjacent total charging capacities to be greater than the preset value $P_{Q5}$. Hence, it can be determined that the dendrites are formed inside the one or more battery cells 21 of the metal battery 200 and the positive and negative electrodes of the one or more battery cells 21 are connected by the dendrites.

A preset value $P_{W4}$ can be set as the maximum limit value of the difference of the two adjacent total charging energies within the normal variation range. Because the total charging energy $W_{charge} = W_{leak} + W_0$, when the positive and negative electrodes of the one or more battery cells 21 are connected by the dendrites, the energy $W_{leak}$ costed by the dendrites can increase significantly, such that a rising transition of the total charging energy $W_{charge}$ can be generated, causing the difference $\Delta W_{charge}$ of the two adjacent total charging energies to be greater than the preset value $P_{W4}$. Hence, it can be determined that the dendrites are formed inside the one or more battery cells 21 of the metal battery 200 and the positive and negative electrodes of the one or more battery cells 21 are connected by the dendrites.

According to the disclosure, by recording the total charging capacity $Q_{charge}$ and/or the total charging energy $W_{charge}$ of the metal battery 200 each time and analyze the change trend of the total charging capacity $Q_{charge}$ and/or the total charging energy $W_{charge}$, when the rising transition of the total charging capacity $Q_{charge}$ and/or the rising transition of the total charging energy $W_{charge}$ occur, it can be determined that the dendrites are formed inside the one or more battery cells 21 of the metal battery 200 and the positive and negative electrodes of the one or more battery cells 21 are connected by the dendrites.

In some embodiments, the electronic parameters can include a total discharging capacity and/or a total discharging energy in a complete discharging process from full charge to zero charge.

When a difference between two adjacent total discharging capacities and/or a difference between two adjacent total discharging energies are greater than the corresponding preset values, the control circuit 12 can determine that the dendrites are formed inside the one or more battery cells 21 of the metal battery 200 and the positive and negative electrodes of the one or more battery cells 21 are connected by the dendrites.

In normal situations, the difference between two adjacent total discharging capacities and/or the difference between two adjacent total discharging energies are not too great in the complete discharging process from full charge to zero charge.

The two adjacent total discharging capacities are set as $Q_{d2}$ and $Q_{d1}$ respectively, thus the difference $\Delta Q_{discharge}$ between two adjacent total discharging capacities can be expressed as:

$$\Delta Q_{discharge} = |Q_{d2} - Q_{d1}|$$

The two adjacent total discharging energies are set as $W_{d2}$ and $W_{d1}$ respectively, thus the difference $\Delta W_{discharge}$ between two adjacent total discharging energies can be expressed as:

$$\Delta W_{discharge} = |W_{d2} - W_{d1}|$$

A preset value $P_{Q6}$ can be set as the maximum limit value of the difference of the two adjacent total discharging capacities within the normal variation range. Because the total discharging capacity $Q_{discharge} = Q_{cell} - Q_{leak}$, when the positive and negative electrodes of the one or more battery cells 21 are connected by the dendrites, the capacity $Q_{leak}$ costed by the dendrites can increase significantly, such that a falling transition of the total discharging capacity $Q_{discharge}$ can be generated, causing the difference $\Delta Q_{discharge}$ of the two adjacent total discharging capacities to be greater than the preset value $P_{Q6}$. Hence, it can be determined that the dendrites are formed inside the one or more battery cells 21 of the metal battery 200 and the positive and negative electrodes of the one or more battery cells 21 are connected by the dendrites.

A preset value $P_{W5}$ can be set as the maximum limit value of the difference of the two adjacent total discharging energies within the normal variation range. Because the total discharging energy $W_{discharge} = W_{cell} - W_{leak}$, when the positive and negative electrodes of the one or more battery cells 21 are connected by the dendrites, the energy $W_{leak}$ costed by the dendrites can increase significantly, such that a falling transition of the total discharging energy $W_{discharge}$ can be generated, causing the difference $\Delta W_{discharge}$ of the two adjacent total discharging energies to be greater than the preset value $P_{W5}$. Hence, it can be determined that the dendrites are formed inside the one or more battery cells 21 of the metal battery 200 and the positive and negative electrodes of the one or more battery cells 21 are connected by the dendrites.

According to the disclosure, by recording the total discharging capacity $Q_{discharge}$ and/or the total discharging energy $W_{discharge}$ of the metal battery 200 each time and analyze the change trend of the total discharging capacity $Q_{discharge}$ and/or the total discharging energy $W_{discharge}$, when the falling transition of the total discharging capacity $Q_{discharge}$ and/or the falling transition of the total discharging energy $W_{discharge}$ occur, it can be determined that the dendrites are formed inside the one or more battery cells 21 of the metal battery 200 and the positive and negative electrodes of the one or more battery cells 21 are connected by the dendrites.

In some embodiments, the electronic parameters can include the total charging capacity in the complete charging process from zero charge to full charge, and the total discharging capacity in the complete discharging process from full charge to zero charge.

The control circuit 12 can determine a difference between the total charging capacity and the total discharging capacity during a charging and discharging cycle, and determine that the dendrites are formed inside the one or more battery cells 21 of the metal battery 200 and the positive and negative electrodes of the one or more battery cells 21 are connected by the dendrites, when the difference between the total charging capacity and the total discharging capacity is greater than the preset value.

In some embodiments, the electronic parameters can include the total charging energy in the complete charging process from zero charge to full charge, and the total discharging energy in the complete discharging process from full charge to zero charge.

The control circuit 12 can determine a difference between the total charging energy and the total discharging energy during a charging and discharging cycle, and determine that the dendrites are formed inside the one or more battery cells 21 of the metal battery 200 and the positive and negative electrodes of the one or more battery cells 21 are connected by the dendrites, when the difference between the total charging energy and the total discharging energy is greater than the preset value.

In normal situations, in the charging and discharging cycle that includes the complete charging process from zero charge to full charge and the complete discharging process from full charge to zero charge, the difference between the total charging capacity and the total discharging capacity and the difference between the total charging energy and the total discharging energy are not too great.

The difference $\Delta Q$ between the total charging capacity and the total discharging capacity in the charging and discharging cycle can be expressed as:

$$\Delta Q = |Q_{charge} - Q_{discharge}|$$

The difference $\Delta W$ between the total charging energy and the total discharging energy in the charging and discharging cycle can be expressed as:

$$\Delta W = |W_{charge} - W_{discharge}|$$

A preset value $P_{Q7}$ can be set as the maximum limit value of the difference between the total charging capacity and the total discharging capacity in the charging and discharging cycle within the normal variation range. Because a relationship between the total charging capacity and the total discharging capacity is $Q_{charge} = Q_{discharge} + Q_{leak}$, when the positive and negative electrodes of the one or more battery cells 21 are connected by the dendrites, the capacity $Q_{leak}$ costed by the dendrites can increase significantly, such that a falling transition of the total discharging capacity $Q_{discharge}$ relative to the total charging capacity $Q_{charge}$ can be generated, causing the difference $\Delta Q$ between the total charging capacity and the total discharging capacity to be greater than the preset value $P_{Q7}$. Hence, it can be determined that the dendrites are formed inside the one or more battery cells 21 of the metal battery 200 and the positive and negative electrodes of the one or more battery cells 21 are connected by the dendrites.

A preset value $P_{W7}$ can be set as the maximum limit value of the difference between the total charging energy and the total discharging energy in the charging and discharging cycle within the normal variation range. Because a relationship between the total charging energy and the total discharging energy is $W_{charge}=W_{discharge}+W_{leak}$, when the positive and negative electrodes of the one or more battery cells 21 are connected by the dendrites, the energy $W_{leak}$ costed by the dendrites can increase significantly, such that a falling transition of the total discharging energy $W_{discharge}$ relative to the total charging energy $W_{charge}$ can be generated, causing the difference $\Delta W$ between the total charging energy and the total discharging energy to be greater than the preset value $P_{W7}$. Hence, it can be determined that the dendrites are formed inside the one or more battery cells 21 of the metal battery 200 and the positive and negative electrodes of the one or more battery cells 21 are connected by the dendrites.

In some embodiments, the memory 13 can be also configured to pre-store a design value of a full capacity of the metal battery 200 or design values of the full capacities of the one or more battery cells 21. The electronic parameters can include the total charging capacity and/or the total discharging capacity of the metal battery 200 or the total charging capacities and/or the total discharging capacities of the one or more battery cells 21.

The control circuit 12 can determine a difference between the design value of the full capacity and the total charging capacity and/or a difference between the design value of the full capacity and the total discharging capacity, according to the design value of the full capacity, the total charging capacity, and/or the total discharging capacity, and determine that the dendrites are formed inside the one or more battery cells 21 of the metal battery 200 and the positive and negative electrodes of the one or more battery cells 21 are connected by the dendrites, when the difference between the design value of the full capacity and the total charging capacity and/or the difference between the design value of the full capacity and the total discharging capacity are greater than the corresponding preset values.

Theoretically, if the metal battery 200 is in normal performance conditions, the difference of the total charging capacity $Q_{charge}$, the total discharging capacity $Q_{discharge}$, and the design value of the full capacity $Q_{design}$ of the metal battery 200 is not too great.

If the dendrites are formed inside the one or more battery cells 21 of the metal battery 200, the total charging capacity $Q_{charge}=Q_0+Q_{leak}$ and the total discharging capacity $Q_{discharge}=Q_0-Q_{leak}$.

The difference $\Delta Q_{dc}$ between the design value of the full capacity $Q_{design}$ and the total charging capacity $Q_{charge}$ can be expressed as:

$$\Delta Q_{dc}=|Q_{design}-Q_{charge}|$$

The difference $\Delta Q_{dd}$ between the design value of the full capacity $Q_{design}$ and the total discharging capacity $Q_{discharge}$ can be expressed as:

$$\Delta Q_{dd}=|Q_{design}-Q_{discharge}|$$

A preset value $P_{Q8}$ can be set as the maximum limit value of the difference between the design value of the full capacity and the total charging capacity within the normal variation range. When the positive and negative electrodes of the one or more battery cells 21 are connected by the dendrites, the capacity $Q_{leak}$ costed by the dendrites can increase significantly, such that the rising transition of the total charging capacity $Q_{charge}$ can be generated, causing the difference $\Delta Q_{dc}$ between the design value of the full capacity $Q_{design}$ and the total charging capacity $Q_{charge}$ to be greater than the preset value $P_{Q8}$. Hence, it can be determined that the dendrites are formed inside the one or more battery cells 21 of the metal battery 200 and the positive and negative electrodes of the one or more battery cells 21 are connected by the dendrites.

A preset value $P_{Q9}$ can be set as the maximum limit value of the difference between the design value of the full capacity and the total discharging capacity within the normal variation range. When the positive and negative electrodes of the one or more battery cells 21 are connected by the dendrites, the capacity $Q_{leak}$ costed by the dendrites can increase significantly, such that the falling transition of the total charging capacity $Q_{discharge}$ can be generated, causing the difference $\Delta Q_{dd}$ between the design value of the full capacity $Q_{design}$ and the total discharging capacity $Q_{discharge}$ to be greater than the preset value $P_{Q9}$. Hence, it can be determined that the dendrites are formed inside the one or more battery cells 21 of the metal battery 200 and the positive and negative electrodes of the one or more battery cells 21 are connected by the dendrites.

In some other embodiments, the memory 13 can be also configured to pre-store a design value of a full energy of the metal battery 200 or the design values of the full energy of the one or more battery cells 21. The electronic parameters can include the total charging energy and/or the total discharging energy of the metal battery 200 or the total charging energies and/or the total discharging energies of the one or more battery cells 21.

The control circuit 12 can determine a difference between the design value of the full energy and the total charging energy and/or a difference between the design value of the full energy and the total discharging energy, according to the design value of the full energy, the total charging energy, and/or the total discharging energy, and determine that the dendrites are formed inside the one or more battery cells 21 of the metal battery 200 and the positive and negative electrodes of the one or more battery cells 21 are connected by the dendrites, when the difference between the design value of the full energy and the total charging energy and/or the difference between the design value of the full energy and the total discharging energy are greater than the corresponding preset values.

Theoretically, if the metal battery 200 is in normal performance conditions, the difference of the total charging energy $W_{charge}$, the total discharging energy $W_{discharge}$, and the design value of the full energy $W_{design}$ of the metal battery 200 is not too great.

If the dendrites are formed inside the one or more battery cells 21 of the metal battery 200, the total charging energy $W_{charge}=W_0+W_{leak}$ and the total discharging energy $W_{discharge}=W_0-W_{leak}$.

The difference $\Delta W_{dc}$ between the design value of the full energy $W_{design}$ and the total charging energy $W_{charge}$ can be expressed as:

$$\Delta W_{dc}=|W_{design}-W_{discharge}|$$

The difference $\Delta W_{dd}$ between the design value of the full energy $W_{design}$ and the total discharging energy $W_{discharge}$ can be expressed as:

$$\Delta W_{dd}=|W_{design}-W_{discharge}|$$

A preset value $P_{W7}$ can be set as the maximum limit value of the difference between the design value of the full energy and the total charging energy within the normal variation range. When the positive and negative electrodes of the one or more battery cells 21 are connected by the dendrites, the energy $W_{leak}$ costed by the dendrites can increase significantly, such that the rising transition of the total charging energy $W_{charge}$ can be generated, causing the difference $\Delta W_{dc}$ between the design value of the full energy $W_{design}$ and the total charging energy $W_{charge}$ to be greater than the preset value $W_{W7}$. Hence, it can be determined that the dendrites are formed inside the one or more battery cells 21 of the metal battery 200 and the positive and negative electrodes of the one or more battery cells 21 are connected by the dendrites.

A preset value $P_{W8}$ can be set as the maximum limit value of the difference between the design value of the full energy and the total discharging energy within the normal variation range. When the positive and negative electrodes of the one or more battery cells 21 are connected by the dendrites, the energy $W_{leak}$ costed by the dendrites can increase significantly, such that the falling transition of the total charging energy $W_{discharge}$ can be generated, causing the difference $\Delta W_{dd}$ between the design value of the full energy $W_{design}$ and the total discharging energy $W_{discharge}$ to be greater than the preset value $P_{W8}$. Hence, it can be determined that the dendrites are formed inside the one or more battery cells 21 of the metal battery 200 and the positive and negative electrodes of the one or more battery cells 21 are connected by the dendrites.

The BMS 100 can timely and effectively discover the formation of the dendrites by using the methods described above, such that the safety measures can be performed in time and the safety accidents can be avoided.

In some embodiments, the BMS 100 also includes an indication unit 14. The control circuit 12 can be further configured to control the indication unit 14 to perform an abnormality notification, when it is determined that that the dendrites are formed inside the one or more battery cells 21 of the metal battery 200 and the positive and negative electrodes of the one or more battery cells 21 are connected by the dendrites.

The indication unit 14 can be at least one of a sound generation device or a display device. When using the sound generation device, the indication unit 14 can make the abnormality notification by emitting an alarm sound or a voice. When using the display device, the indication unit 14 can make the abnormality notification by flashing light or displaying text.

In some embodiments, the control circuit 12 can be also configured to cut off a current loop where the metal battery 200 is located, when it is determined that that the dendrites are formed inside the one or more battery cells 21 of the metal battery 200 and the positive and negative electrodes of the one or more battery cells 21 are connected by the dendrites.

According to the disclosure, the BMS 100 determines whether the dendrites are formed inside the one or more battery cells by real-time monitoring of the electrical parameters of the metal battery 200, such as the charging current, the discharging current, the charging voltage, the discharging voltage, the charging capacity, the discharging capacity, the charging energy, the discharging energy, the resting voltage, the remaining capacity in the resting state, or the like. As such, the technical problem of how to detect the formation of the dendrites inside the battery can be effectively solved, the safety measures can be performed in time, and the safety accidents can be avoided.

In addition, the BMS 100 has a simple structure and can be well integrated with the existing metal battery 200 and management system without adding additional components or complicating the internal structure of the existing battery cells 21, such that the BMS 100 is in accordance with the existing equipment and processes for the large-scale production of lithium batteries and the complexity of the BMS 100 does not need to be increased. Although the BMS 100 consistent with the disclosure cannot suppress the formation of the dendrites and can only successfully detect after the dendrite grows to connect the positive and negative electrodes, which however is the most important moment for the safe use of batteries.

Figure 9:
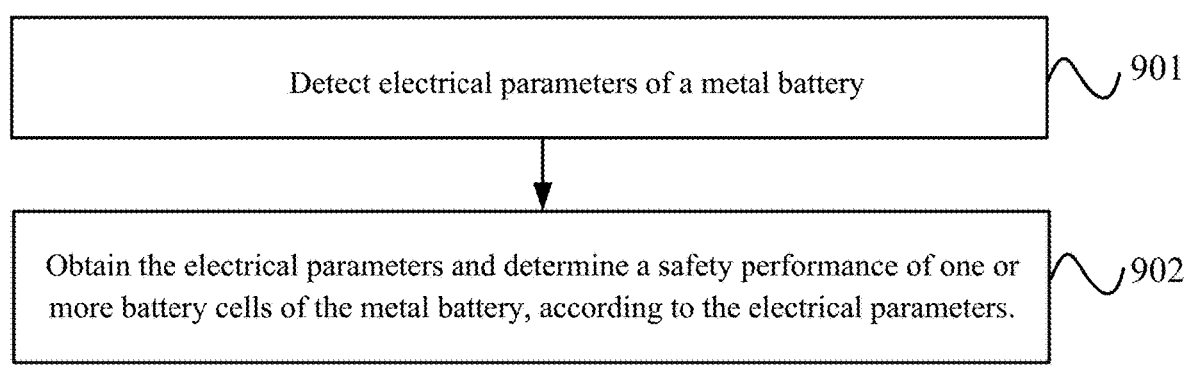
FIG. 9 is a schematic flow chart of a control method of a metal battery according to the disclosure.

FIG. 9 is a schematic flow chart of an exemplary control method of a metal battery consistent with the disclosure. The control method is configured to manage the one or more battery cells of the metal battery, so as to monitor the safety performance of the one or more battery cells of the metal battery. It is not intend to limit the method of the present disclosure to the processes and the sequence shown in FIG. 9. The processes shown in FIG. 9 can be added, removed, or changed in order.

As shown in FIG. 9, at 901, electrical parameters of the metal battery are detected.

The electrical parameters can include at least one of the energy of the metal battery, the capacity of the metal battery, the voltage of the metal battery, the current of the metal battery, energies of the one or more battery cells, capacities of the one or more battery cells, voltages of the one or more battery cells, or currents of the one or more battery cells.

At 902, the electrical parameters are obtained, and a safety performance of the one or more battery cells of the metal battery is determined according to the electrical parameters.

In some embodiments, the control method can also include storing the electrical parameters of the metal battery.

In some embodiments, the processes at 902 can include determining at least one change value of the electrical parameters of the metal battery, according to the electrical parameters at different times, and determining the safety performance of the one or more battery cells of the metal battery, according to at least one comparison result between the at least one change value and the at least one preset value.

The at least one change value can include the change rate, the change trend, or the like. The at least one preset value can be set as the maximum limit value or the minimum limit value of the normal variation range of the change rate, or the maximum limit value or the minimum limit value of the normal variation range of the change trend.

Because when the metal battery is in the charging process, the dendrites can be formed inside the one or more battery cells and the positive and negative electrodes of the one or more battery cells can be connected by the dendrites to cause the short circuit, a large amount of the charging capacity or the charging energy can be consumed, such that relatively sharp transitions of the electrical parameters of the metal battery and/or the one or more battery cells can be generated. For example, a large rising transition of the charging capacity or the charging energy of the metal battery and/or the large rising transitions of the charging capacities or the charging energies of the one or more battery cells can be generated, or a large rising transition or a falling transition of the charging voltage or the charging current of the metal battery and/or the large rising transitions or the falling transitions of the charging voltages or the charging currents of one or more battery cells can be generated. The control method can monitor the formation of dendrites during the charging of the metal battery according to the above-described situations.

In some embodiments, the processes at 902 can include determining at least one change value of the electrical parameters of the metal battery in the charging state, according to the electrical parameters at different times, and determining the safety performance of the one or more battery cells of the metal battery, according to at least one comparison result between the at least one change value and the at least one preset value.

In some embodiments, the electrical parameters can include the charging current of the metal battery and/or the charging currents of the one or more battery cells.

The processes at 902 can include determining the increase rate of the charging current, according to the difference of the charging currents at different times, when the metal battery is in the constant voltage charging state, and when the increase rate of the charging current is greater than the preset value, determining that the dendrites are formed inside the one or more battery cells of the metal battery and the positive and negative electrodes of the one or more battery cells are connected by the dendrites.

In some embodiments, the electrical parameters can include the charging capacity and/or the charging energy of the metal battery and/or the charging capacities and/or the charging energies of the one or more battery cells.

The processes at 902 can include determining the increase rate of the charging capacity and/or the increase rate of the charging energy, according to the difference of the charging capacities and/or the difference of the charging energies at different times, when the metal battery is in the constant voltage charging state, and when the increase rate of the charging capacity and/or the increase rate of the charging energy are greater than the corresponding preset values, determining that the dendrites are formed inside the one or more battery cells of the metal battery and the positive and negative electrodes of the one or more battery cells are connected by the dendrites.

In some embodiments, the electrical parameters can include the charging voltage of the metal battery and/or the charging voltages of the one or more battery cells.

The processes at 902 can include determining the decrease rate of the charging voltage, according to the difference of the charging voltages at different times, when the metal battery is in the constant current charging state, and when the decrease rate of the charging voltage is greater than the preset value, determining that the dendrites are formed inside the one or more battery cells of the metal battery and the positive and negative electrodes of the one or more battery cells are connected by the dendrites.

In some embodiments, the electrical parameters can include the charging energy of the metal battery and/or the charging energies of the one or more battery cells.

The processes at 902 can include determining the increase rate of the charging energy, according to the difference of the charging energies at different times, when the metal battery is in the constant current charging state, and when the increase rate of the charging energy is greater than the preset value, determining that the dendrites are formed inside the one or more battery cells of the metal battery and the positive and negative electrodes of the one or more battery cells are connected by the dendrites.

In some embodiments, the processes at 902 can include determining at least one change value of the electrical parameters of the metal battery in the discharging state according to the electrical parameters at different times and determining the safety performance of the one or more battery cells of the metal battery, according to at least one comparison result between the at least one change value and the at least one preset value.

Because when the metal battery is in the discharging process, the dendrites can also be formed inside the one or more battery cells and the positive and negative electrodes of the one or more battery cells can be connected by the dendrites to cause the short circuit, a large amount of the discharging capacity or the discharging energy can be consumed, such that the relatively sharp transitions of the electrical parameters of the metal battery and/or the one or more battery cells can be generated. For example, the large falling transition of the discharging capacity or the discharging energy of the metal battery and/or the large falling transitions of the discharging capacities or the discharging energies of the one or more battery cells can be generated, or the large rising transition or the falling transition of the discharging voltage or the discharging current of the metal battery and/or the large rising transitions or the falling transitions of the discharging voltages or the discharging currents the one or more battery cells can be generated. The control method can monitor the formation of dendrites during the discharging of the metal battery according to the above-described situations.

In some embodiments, the processes at 902 can include determining at least one change value of the electrical parameters of the metal battery in the discharging state, according to the electrical parameters at different times, and determining the safety performance of the one or more battery cells of the metal battery, according to at least one comparison result between the at least one change value and the at least one preset value.

In some embodiments, the electrical parameters can include the discharging current of the metal battery and/or the discharging currents of the one or more battery cells.

The processes at 902 can include determining the decrease rate of the discharging current, according to the difference of the discharging currents at different times, when the metal battery is in the discharging state, and when the decrease rate of the discharging current is greater than the preset value, determining that the dendrites are formed inside the one or more battery cells of the metal battery and the positive and negative electrodes of the one or more battery cells are connected by the dendrites.

In some embodiments, the electrical parameters can include the discharging capacity and/or the discharging energy of the metal battery and/or the discharging capacities and/or the discharging energies of the one or more battery cells.

The processes at 902 can include determining the increase rate of the discharging capacity and/or the increase rate of the discharging energy, according to the difference of the charging capacities and/or the difference of the charging energies at different times, when the metal battery is in the discharging state, and when the increase rate of the discharging capacity and/or the increase rate of the discharging energy are less than the corresponding preset values, determining that the dendrites are formed inside the one or more battery cells of the metal battery and the positive and negative electrodes of the one or more battery cells are connected by the dendrites.

Because when the metal battery is in the resting state, i.e., the non-charging and non-discharging state, the dendrites can also be formed inside the one or more battery cells due to internal or external extrusions, hits, or the like, and the positive and negative electrodes of the one or more battery cells can be connected by the dendrites to cause the short circuit, a large amount of capacity can be consumed, such that the relatively sharp transitions of the electrical parameters of the metal battery and/or the one or more battery cells can be generated. For example, the large falling transition of the remaining capacity of the metal battery and/or the large falling transitions of the remaining capacities of the one or more battery cells can be generated, or the large falling transition of the resting voltage of the metal battery and/or the large falling transitions of the resting voltages of the one or more battery cells can be generated. The control method can monitor the formation of dendrites in the metal battery during the resting state according to the above-described situations.

In some embodiments, the processes at 902 can include determining at least one change value of the electrical parameters of the metal battery in the resting state, according to the electrical parameters at different times, and determining the safety performance of the one or more battery cells of the metal battery, according to at least one comparison result between the at least one change value and the at least one preset value.

In some embodiments, the electrical parameters can include the resting voltage and/or the remaining capacity of the metal battery in the resting state and/or the resting voltages and/or the remaining capacities of the one or more battery cells.

The processes at 902 can include determining the decrease rate of the resting voltage and/or the decrease rate of the remaining capacity, according to the difference of the resting voltages and/or the difference of the remaining capacities at different times, when the metal battery is in the resting state, and when the decrease rate of the resting voltage and/or the decrease rate of the remaining capacity are greater than the corresponding preset values, determining that the dendrites are formed inside the one or more battery cells of the metal battery and the positive and negative electrodes of the one or more battery cells are connected by the dendrites.

In some embodiments, the metal battery can include the plurality of battery cells connected in series and/or in parallel. The control method further includes storing the electrical parameters of the plurality of battery cells of the metal battery.

The processes at 902 can include obtaining the electrical parameters of the plurality of battery cells of the metal battery at a same time and determining the safety performance of the plurality of battery cells of the metal battery according to the electrical parameters at the same time.

In some embodiments, the electronic parameters can include the resting voltages of the plurality of battery cells. The processes at 902 can include determining the resting voltage differences between each two of the plurality of battery cells, according to the resting voltages of the plurality of battery cells of the metal battery at the same moment in the resting state, determining the maximum value of the resting voltage differences between each two of the plurality of battery cells, and determining the safety performance of the plurality of battery cells of the metal battery according to a comparison result between the maximum value of the resting voltage differences between each two of the plurality of battery cells and the preset value.

In some embodiments, the processes at 902 further include: when the maximum value of the resting voltage differences between each two of the plurality of battery cells is greater than the preset value, determining that the dendrites are formed inside at least one of the plurality of battery cells of the metal battery and the positive and negative electrodes of at least one of the plurality of battery cells are connected by the dendrites.

The control method can timely and effectively discover the formation of the dendrites by using the methods described above, such that the safety measures can be performed in time and the safety accidents can be avoided.

In some embodiments, the electronic parameters can include the total charging capacity and/or the total charging energy in the complete charging process from zero charge to full charge.

The processes at 902 can include: when the difference between two adjacent total charging capacities and/or the difference between two adjacent total charging energies are greater than the corresponding preset values, determining that the dendrites are formed inside the one or more battery cells of the metal battery and the positive and negative electrodes of the one or more battery cells are connected by the dendrites.

In some embodiments, the electronic parameters can include the total discharging capacity and/or the total discharging energy in the complete discharging process from full charge to zero charge.

The processes at 902 can include: when the difference between two adjacent total discharging capacities and/or the difference between two adjacent total discharging energies are greater than the corresponding preset values, determining that the dendrites are formed inside the one or more battery cells of the metal battery and the positive and negative electrodes of the one or more battery cells are connected by the dendrites.

In some embodiments, the electronic parameters can include the total charging capacity in the complete charging process from zero charge to full charge, and the total discharging capacity in the complete discharging process from full charge to zero charge.

The processes at 902 can include: determining the difference between the total charging capacity and the total discharging capacity during the charging and discharging cycle, and when the difference between the total charging capacity and the total discharging capacity is greater than the preset value, determining that the dendrites are formed inside the one or more battery cells of the metal battery and the positive and negative electrodes of the one or more battery cells are connected by the dendrites.

In some embodiments, the electronic parameters can include the total charging energy in the complete charging process from zero charge to full charge, and the total discharging energy in the complete discharging process from full charge to zero charge.

The processes at 902 can include: determine the difference between the total charging energy and the total discharging energy during the charging and discharging cycle, and when the difference between the total charging energy and the total discharging energy is greater than the preset value, determining that the dendrites are formed inside the one or more battery cells of the metal battery and the positive and negative electrodes of the one or more battery cells are connected by the dendrites.

In some embodiments, the control method also include pre-storing a design value of a full capacity of the metal battery or design values of the full capacities of the one or more battery cells. The electronic parameters can include the total charging capacity and/or the total discharging capacity of the metal battery or the total charging capacities and/or the total discharging capacities of the one or more battery cells.

The processes at 902 can include: determining a difference between the design value of the full capacity and the total charging capacity and/or a difference between the design value of the full capacity and the total discharging capacity, according to the design value of the full capacity, the total charging capacity, and/or the total discharging capacity, and when the difference between the design value of the full capacity and the total charging capacity and/or the difference between the design value of the full capacity and the total discharging capacity are greater than the corresponding preset values, determining that the dendrites are formed inside the one or more battery cells of the metal battery and the positive and negative electrodes of the one or more battery cells are connected by the dendrites.

In some other embodiments, the control method can also include pre-storing a design value of a full energy of the metal battery or the design values of the full energy of the one or more battery cells. The electronic parameters can include the total charging energy and/or the total discharging energy of the metal battery or the total charging energies and/or the total discharging energies of the one or more battery cells.

The processes at 902 can include: determining a difference between the design value of the full energy and the total charging energy and/or a difference between the design value of the full energy and the total discharging energy, according to the design value of the full energy, the total charging energy, and/or the total discharging energy, and when the difference between the design value of the full energy and the total charging energy and/or the difference between the design value of the full energy and the total discharging energy are greater than the corresponding preset values, determining that the dendrites are formed inside the one or more battery cells of the metal battery and the positive and negative electrodes of the one or more battery cells are connected by the dendrites.

The control method can timely and effectively discover the formation of the dendrites by using the methods described above, such that the safety measures can be performed in time and the safety accidents can be avoided.

In order to facilitate taking safety measures and avoid safety accidents, the control method can also include: performing an abnormality notification when it is determined that that the dendrites are formed inside the one or more battery cells of the metal battery and the positive and negative electrodes of the one or more battery cells are connected by the dendrites, and/or cutting off a current loop where the metal battery is located, when it is determined that that the dendrites are formed inside the one or more battery cells of the metal battery and the positive and negative electrodes of the one or more battery cells are connected by the dendrites.

According to the disclosure, the control method determines whether the dendrites are formed inside the one or more battery cells by real-time monitoring of the electrical parameters of the metal battery, such that the technical problem of how to detect the formation of the dendrites inside the battery can be effectively solved, the safety measures can be performed in time, and the safety accidents can be avoided.

Figure 10:
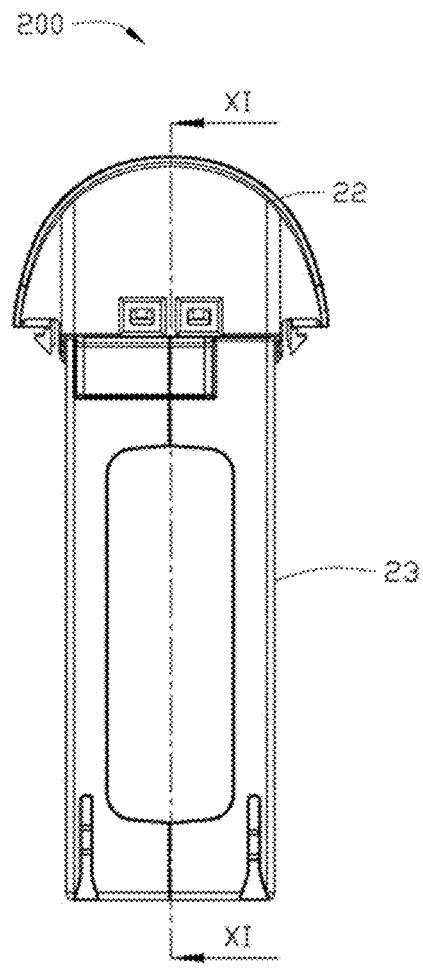
FIG. 10 is a schematic view of a metal battery according to the disclosure.
Figure 11:
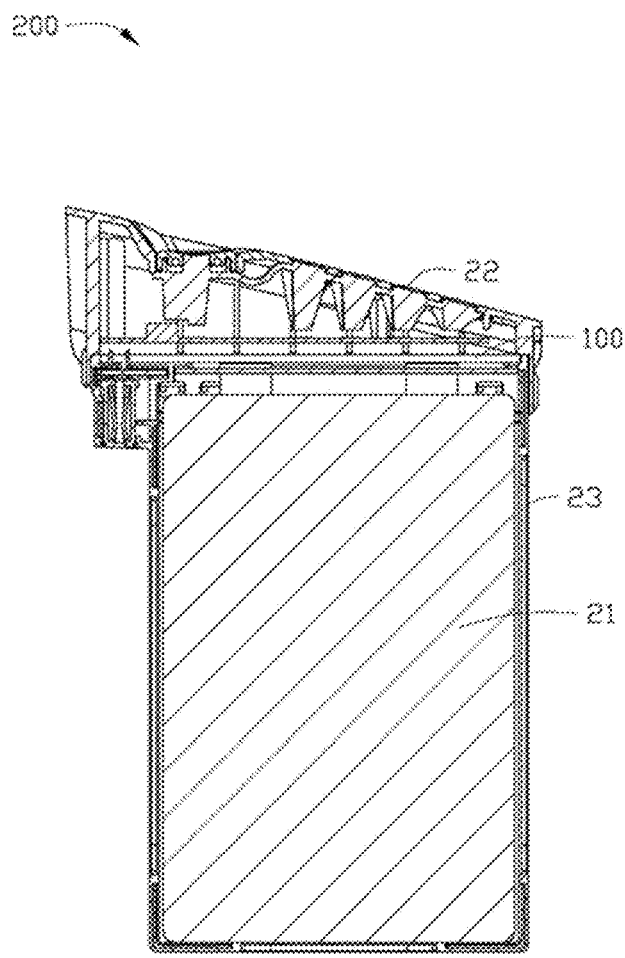
FIG. 11 is a cross-sectional view of the metal battery in FIG. 10 along a XI-XI line.

FIG. 10 is a schematic view of a metal battery 200 consistent with the disclosure. FIG. 11 is a cross-sectional view of the metal battery 200 in FIG. 10 along a XI-XI line. As shown in FIGS. 10 and 11, the metal battery 200 includes a cover 22, a housing 23, the one or more battery cells 21 provided inside the house 23, and the BMS 100. The BMS 100 is provided inside the housing 23 in a form of one or more circuit boards. The indication unit 14 of the BMS 100 is provided on the housing 23 and exposed outside the housing 23. In some embodiments, The indication unit 14 can be also provided inside the housing 23. In some other embodiments, the indication unit 14 can be partially provided inside the housing 23 and partially provided on the housing 23.

The metal battery 200 can effectively discover the formation of the dendrites by using the BMS 100, such that the safety measures can be performed in time and the safety accidents can be avoided.

Those of ordinary skill in the art will appreciate that the exemplary features and algorithm steps described above can be implemented in electronic hardware, computer software, firmware, or in a combination thereof. Therefore, the features of the disclosure can be implemented using a processing system, for example, including one or more processors. Exemplary processors can include but are not limited to: one or more general purpose microprocessors (for example, single or multi-core processors), application-specific integrated circuits, dedicated instruction set processors, graphics processing units, physical processing units, digital signal processing units, coprocessors, network processing units, audio processing units, encryption processing units, or the like.

A method consistent with the disclosure can be implemented in the form of computer program product. The program product can be one or more storage mediums or one or more computer-readable storage mediums having instructions stored thereon or therein. The instructions that enable a computer device, such as a personal computer, a server, or a network device, to perform part or all of a method consistent with the disclosure, such as one of the exemplary methods described above. The storage medium can include but is not limited to a floppy disk, an optical disk, a digital versatile disc (DVD), a compact disc read-only memory (SD-ROM), a micro hard disk, a magneto-optical disk a read-only memory (ROM), a random access memory (RAM), an erasable programmable read-only memory (EPROM), an electrically erasable programmable read-only memory (EPROM), a dynamic random access memory (DRAM), a video random access memory (VRAM), a flash memory device, a magnetic card, an optical card, a nano system including molecular memory integrated circuit (IC), or any medium that can store instructions and/or data.

Features of the disclosure can be incorporated into a software and/or a firmware to control the hardware of the processing system by being stored on any one or more of the computer-readable storage mediums and enable the processing system to interact with other mechanisms that utilize the present disclosure. The software or the firmware can include, but is not limited to, application codes, device drivers, operating systems, and execution environments/containers.

The features of the disclosure can be implemented in hardware, for example, an application specific integrated circuit (ASIC), a field programmable gate array (FPGA), or another hardware component. It will be apparent to those skilled in the art that a hardware state machine can be implemented to perform the functions disclosed herein.

In addition, features of the disclosure can be implemented by one or more conventional general purpose or special purpose digital computers, computing devices, machines, or microprocessors (including one or more processors, memories, and/or computer-readable storage mediums from consideration of the specification and practice of the embodiments disclosed herein). It will be apparent to those skilled in the software arts that a skilled programmer can readily prepare suitable software codes from consideration of the specification and practice of the embodiments disclosed herein.

It is intended that the specification and examples be considered as exemplary only and not to limit the scope of the disclosure. Other modifications of, or equivalents to the disclosed embodiments are intended to be encompassed within the scope of the present disclosure.

What is claimed is:

1. A battery management system comprising:
a detection circuit configured to detect a plurality of electrical parameters of a metal battery that includes a plurality of battery cells connected to each other, the plurality of electrical parameters including a resting voltage of each of the plurality of battery cells when the metal battery is in a resting state;
a memory electrically connected to the detection circuit, and storing the plurality of electrical parameters and a preset value; and
a control circuit configured to:
be electrically connected to the memory to obtain the plurality of electrical parameters; and
determine a safety performance of the metal battery according to the electrical parameters, including:
obtaining, from the memory, a value of a resting voltage of each of the plurality of battery cells at a same time when the metal battery is in the resting state;
determining, for the plurality of battery cells, resting voltage differences each being a difference between values of resting voltages of two of the plurality of battery cells at the same time;
determining a maximum value of the resting voltage differences; and
determining the safety performance of the metal battery according to a comparison result between the maximum value of the resting voltage differences and the preset value.

2. The battery management system of claim 1, wherein:
the detection circuit includes at least one of a current detection circuit, a voltage detection circuit, or a voltameter, and/or
the plurality of electrical parameters further include at least one of an energy of the metal battery, a capacity of the metal battery, a voltage of the metal battery, a current of the metal battery, an energy of each of the plurality of battery cells, a capacity of each of the plurality of battery cells, a voltage of each of the plurality of battery cells, or a current of each of the plurality of battery cells.

3. The battery management system of claim 1, wherein the control circuit includes at least one of a microprocessor or a circuit including one or more circuit boards.

4. The battery management system of claim 1, wherein the control circuit is further configured to:
obtain values of the plurality of electrical parameters of the metal battery at different times from the memory; and
determine the safety performance of the metal battery according to the values of the plurality of electrical parameters at the different times.

5. The battery management system of claim 4, wherein:
the memory further stores a preset change value; and
the control circuit is further configured to:
determine a change value of one of the plurality of electrical parameters of the metal battery according to the values of the plurality of electrical parameters at the different times; and
determine the safety performance the metal battery further according to a comparison result between the change value and the preset change value.

6. The battery management system of claim 5, wherein the change value is determined when the metal battery is in a charging state.

7. The battery management system of claim 6, wherein:
the plurality of electrical parameters include at least one of a charging capacity or a charging energy of one of the plurality of battery cells; and
the control circuit is further configured to, while the metal battery is in a constant voltage charging state:
determine at least one of an increase rate of the charging capacity or an increase rate of the charging energy according to at least one of a difference of values of the charging capacity at the different times or a difference of values of the charging energy at the different times; and
in response to the at least one of the increase rate of the charging capacity or the increase rate of the charging energy being greater than the preset change value, determine that dendrites are formed inside the one of the plurality of battery cells of the metal battery and positive and negative electrodes of the one of the plurality of battery cells are connected by the dendrites.

8. The battery management system of claim 6, wherein:
the plurality of electrical parameters include a charging current of one of the plurality of battery cells; and
the control circuit is further configured to, while the metal battery is in a constant voltage charging state:
determine an increase rate of the charging current according to a difference of values of the charging current at the different times; and
in response to the increase rate of the charging current being greater than the preset change value, determine that dendrites are formed inside the one of the plurality of battery cells of the metal battery and positive and negative electrodes of the one of the plurality of battery cells are connected by the dendrites.

9. The battery management system of claim 6, wherein:
the plurality of electrical parameters include a charging energy of one of the plurality of battery cells; and
the control circuit is further configured to, while the metal battery is in a constant current charging state:
determine an increase rate of the charging energy according to a difference of values of the charging energy at the different times; and
in response to the increase rate of the charging energy being greater than the preset change value, determine that dendrites are formed inside the one of the plurality of battery cells of the metal battery and positive and negative electrodes of the one of the plurality of battery cells are connected by the dendrites.

10. The battery management system of claim 6, wherein:
the plurality of electrical parameters include a charging voltage of one of the plurality of battery cells; and
the control circuit is further configured to, while the metal battery is in a constant current charging state:
determine a decrease rate of the charging voltage according to a difference of values of the charging voltage at the different times; and in response to the decrease rate of the charging voltage being greater than the preset change value, determine that dendrites are formed inside the one of the plurality of battery cells of the metal battery and positive and negative electrodes of the one of the plurality of battery cells are connected by the dendrites.

11. The battery management system of claim 5, wherein the change value is determined when the metal battery in a discharging state.

12. The battery management system of claim 11, wherein:
the plurality of electrical parameters include at least one of a discharging capacity or a discharging energy of one of the plurality of battery cells; and
the control circuit is further configured to, while the metal battery is in the discharging state:
   determine at least one of an increase rate of the discharging capacity or an increase rate of the discharging energy according to at least one a difference of values of the charging capacity at the different times or a difference of values of the charging energy at the different times; and
   in response to the at least one of the increase rate of the discharging capacity or the increase rate of the discharging energy being less than the preset change value, determine that dendrites are formed inside the one of the plurality of battery cells of the metal battery and positive and negative electrodes of the one of the plurality of battery cells are connected by the dendrites.

13. The battery management system of claim 11, wherein:
the plurality of electrical parameters include a discharging current of one of the plurality of battery cells; and
the control circuit is further configured to, while the metal battery is in the discharging state:
   determine a decrease rate of the discharging current according to a difference of values of the discharging current at the different times; and
   in response to the decrease rate of the discharging current being greater than the preset change value, determine that dendrites are formed inside the one of the plurality of battery cells of the metal battery and positive and negative electrodes of the one of the plurality of battery cells are connected by the dendrites.

14. The battery management system of claim 5, wherein the change value is determined when the metal battery is in the resting state.

15. The battery management system of claim 14, wherein:
the plurality of electrical parameters include at least one of a resting voltage or a remaining capacity of one of the plurality of battery cells; and
the control circuit is further configured to, while the metal battery is in the resting state:
   determine at least one of a decrease rate of the resting voltage or a decrease rate of the remaining capacity according to at least one of a difference of values of the resting voltage at the different times or a difference of values of the remaining capacity at the different times; and
   in response to the at least one of the decrease rate of the resting voltage or the decrease rate of the remaining capacity being greater than the preset change value, determine that dendrites are formed inside the one of the plurality of battery cells of the metal battery and positive and negative electrodes of the one of the plurality of battery cells are connected by the dendrites.

16. The battery management system of claim 5, wherein:
the plurality of electrical parameters include at least one of a total charging capacity or a total charging energy in a complete charging process from zero charge to full charge; and
the control circuit is further configured to, in response to at least one of a difference between two adjacent values of the total charging capacity or a difference between two adjacent values of the total charging energy being greater than the preset change value, determine that dendrites are formed inside the one of the plurality of battery cells of the metal battery and positive and negative electrodes of the one of the plurality of battery cells are connected by the dendrites, the two adjacent values of the total charging capacity being measured during two adjacent charging processes, respectively, and the two adjacent values of the total charging energy being measured during two adjacent charging processes, respectively.

17. The battery management system of claim 5, wherein:
the plurality of electrical parameters include at least one of a total discharging capacity or a total discharging energy in a complete discharging process from full charge to zero charge; and
the control circuit is further configured to, in response to at least one of a difference between two adjacent values of the total discharging capacity or a difference between two adjacent values of the total discharging energy being greater than the preset change value, determine that dendrites are formed inside the one of the plurality of battery cells of the metal battery and positive and negative electrodes of the one of the plurality of battery cells are connected by the dendrites, the two adjacent values of the total discharging capacity being measured during two adjacent discharging processes, respectively, and the two adjacent values of the total discharging energy being measured during two adjacent discharging processes, respectively.

18. The battery management system of claim 1, wherein the control circuit is further configured to, in response to the maximum value of the resting voltage differences being greater than the preset value, determine that dendrites are formed inside at least one of the plurality of battery cells of the metal battery and positive and negative electrodes of the at least one of the plurality of battery cells are connected by the dendrites.

* * * * *